United States Patent
Ramorini et al.

(10) Patent No.: US 11,811,298 B2
(45) Date of Patent: Nov. 7, 2023

(54) CONTROL CIRCUIT FOR AN ELECTRONIC CONVERTER, RELATED INTEGRATED CIRCUIT, ELECTRONIC CONVERTER AND METHOD OF OPERATING AN ELECTRONIC CONVERTER

(71) Applicant: STMicroelectronics S.r.l., Agrate Brianza (IT)

(72) Inventors: Stefano Ramorini, Milan (IT); Roberto Pio Baorda, Casarile (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 94 days.

(21) Appl. No.: 17/533,519

(22) Filed: Nov. 23, 2021

(65) Prior Publication Data
US 2022/0173657 A1 Jun. 2, 2022

(30) Foreign Application Priority Data
Nov. 27, 2020 (IT) .......................... 102020000028832

(51) Int. Cl.
*H02M 3/158* (2006.01)
*H02M 1/00* (2006.01)

(52) U.S. Cl.
CPC ......... *H02M 1/0009* (2021.05); *H02M 3/158* (2013.01)

(58) Field of Classification Search
CPC ............................. H02M 1/0009; H02M 3/158
See application file for complete search history.

(56) References Cited

U.S. PATENT DOCUMENTS

| 2010/0289473 A1* | 11/2010 | Ishii | H02M 3/156 323/284 |
| --- | --- | --- | --- |
| 2011/0234273 A1 | 9/2011 | Lin et al. | |
| 2019/0324063 A1 | 10/2019 | Baorda et al. | |
| 2019/0386481 A1* | 12/2019 | Cho | H02M 1/32 |
| 2021/0175804 A1* | 6/2021 | Shumkov | H02M 3/1582 |

OTHER PUBLICATIONS

IT Search Report and Written Opinion for priority application (IT Appl. 102020000028832) dated Jul. 29, 2021 (8 pages).
L. Wuidart: Application Note: "Topologies for Switched Mode Power Supplies," STMicroelectronics 1999, AN513/0393, 18 pages.

* cited by examiner

*Primary Examiner* — Alex Torres-Rivera
(74) *Attorney, Agent, or Firm* — CROWE & DUNLEVY

(57) ABSTRACT

A sensor circuit for a power FET monitors current flowing through the FET and includes a regulator circuit regulating a first current flowing through a sense resistance, so voltage drop at the sense resistance corresponds to voltage drop between terminals of the FET. A measurement circuit provides a second current corresponding (or being proportional) to the first current. A first switch selectively applies the second current to a resistor based on a first control signal, and a low pass filter generates a low-pass filtered signal by filtering voltage at the resistor. A voltage follower generates a replica of the low-pass filtered signal, and a second switch selectively applies the replica to the resistor. When the FET is closed, a control circuit closes the first switch and opens the second electronic switch. When the FET is opened, the control circuit opens the first electronic switch and closes the second electronic switch.

18 Claims, 13 Drawing Sheets

US 11,811,298 B2

CONTROL CIRCUIT FOR AN ELECTRONIC CONVERTER, RELATED INTEGRATED CIRCUIT, ELECTRONIC CONVERTER AND METHOD OF OPERATING AN ELECTRONIC CONVERTER

PRIORITY CLAIM

This application claims the priority benefit of Italian Application for Patent No. 102020000028832, filed on Nov. 27, 2020, the content of which is hereby incorporated by reference in its entirety to the maximum extent allowable by law.

TECHNICAL FIELD

Embodiments of the present disclosure relate to approaches for measuring current flows in an electronic power converter, e.g., for controlling the electronic power converter and/or for reducing power losses in the electronic power converter.

BACKGROUND

Power-supply circuits, such as AC/DC or DC/DC switched mode power supplies, are well known in the art. There exist many types of electronic power converters, which are mainly divided into isolated and non-isolated converters. For instance, non-isolated electronic power converters are the converters of the "buck", "boost", "buck-boost", "Ćuk", "SEPIC", and "ZETA" type. Differently, isolated converters are, for instance, converters of the "flyback", "forward", "half-bridge", and "full-bridge" type. Such types of converters are well known to the person skilled in the art, as evidenced e.g., by the published Application Note AN513/0393 "Topologies for Switched Mode Power Supplies", L. Wuidart, 1999, STMicroelectronics, the contents of which are incorporated by reference.

FIG. 1 is a schematic illustration of a DC/DC electronic power converter 20. In particular, a generic electronic power converter 20 comprises two input terminals 200a and 200b for receiving a DC voltage $V_{in}$ and two output terminals 202a and 202b for supplying a DC voltage $V_{out}$. For example, the input voltage $V_{in}$ may be supplied by a DC voltage source 10, such as a battery, or may be obtained from an AC voltage by using a rectifier circuit, such as a bridge rectifier, and possibly a filtering circuit. Instead, the output voltage $V_{out}$ may be used to supply a load 30.

As is known, an electronic power converter comprises one or more reactive components, such as inductances and/or capacitances, and one or more electronic switches configured to control: the current flow from the input terminals 200a and 200b to the one or more reactive components, and/or the current flow from the one or more reactive components to the output terminals 202a and 202b.

In order to reduce the power consumption of the converter, recently it has also been proposed to use a power switch partitioning, wherein one or more of the electronic switches of the electronic power converter 20 are implemented with: a plurality of electronic switches connected in parallel, and/or a FET, wherein the width of the active channel may be controlled selectively, thereby virtually implementing a plurality of electronic switches connected in parallel.

For example, FIG. 2 shows an example wherein an electronic switch Q, is implemented with a plurality of Field-Effect Transistors (FETs), connected in parallel, such as four FETs Qa, Qb, Qc and Qd. In this case, the drain terminals of the plurality of FETs Qa-Qd are connected to a first terminal T1 and the source terminals of the plurality of FETs Qa-Qd are connected to a second terminal T2. Conversely, each of the gate terminals of the plurality of FETs Qa-Qd are connected to a respective terminal for receiving a respective drive signal, e.g., drive signals DRVa, DRVb, DRVc and DRVd. Generally, also any other number of parallel connected electronic switches with respective drive signals may be used.

Accordingly, in this case, a control circuit of the electronic power converter may be configured to generate the drive signals DRVa-DRVd for the electronic switches Qa-Qd, in order to select the number of electronic switches, which should be closed contemporaneously.

In fact, the primary sources of loss in a switched mode power supply usually vary with different load currents. For example, at high output loads (high current flows), the dominant source of loss is the power converted into heat across the resistance of the electronic switches, and the reactive component(s). At low output loads (low current flows), the dominant source is switching the electronic switches on and off. For example, the power required to switch the gate of a FET is usually rather constant at any load, but as more current is drawn by the load, the power used to switch the gate becomes a less significant portion of the total power converted.

Thus, when splitting the electronic switch into a plurality of parallel electronic switches, the effective size of the power switches may be controlled and the control circuit of the electronic power converter may balance: the total switch-on resistance $R_{DSon}$, which decreases when increasing the number of closed electronic switches; and the switching losses, which decrease when decreasing the number of closed electronic switches.

For example, the control circuit may be configured to: at high current flows, close more electronic switches Qa-Qd, thereby reducing the power losses in the switch-on resistance $R_{DSon}$, and at low current flows, close less electronic switches Qa-Qd, thereby reducing the switching losses required to close the electronic switches Qa-Qd.

For example, in order to decide the number of electronic switches Qa-Qb which should be closed, i.e., the partitioning of the electronic switches, the control circuit may determine a value indicative of (and preferably proportional to) the average current flowing through the electronic switch Q, i.e., the total current flowing through the electronic switches Qa-Qd.

Moreover, in many applications it is also useful to monitor (directly or indirectly) other (instantaneous or average values of) currents of the electronic power converter 20, such as the current flowing through one or more reactive components and/or the current provided via the output terminals 202a/202b. For example, such current flows may be used to regulate the electronic power converter 20.

In view of the above, there is a need in the art to provide approaches for monitoring current flows in an electronic power converter, e.g., for determining a number of parallel-connected electronic switches to be closed.

SUMMARY

According to one or more embodiments, one or more of the above objectives is achieved by a control circuit for an electronic power converter. Embodiments moreover concern a related integrated circuit, electronic power converter, and method of operating an electronic power converter.

As mentioned before, various embodiments of the present disclosure relate to a sensor system, e.g., implemented in an integrated circuit. In various embodiments, the sensor system comprises a power FET comprising a first and a second terminal defining a current path, and a gate terminal configured to receive a drive signal. The sensor system also includes a sensor circuit configured to monitor a current flowing through the power FET.

Specifically, in various embodiments, the sensor circuit comprises a sense resistance and a regulator circuit. Specifically, the regulator circuit is configured to: when the drive signal applied to the gate terminal indicates that the power FET is opened, set a first current flowing through the sense resistance to zero, and when the drive signal applied to the gate terminal indicates that the power FET is closed, regulate the first current flowing through the sense resistance, such that the voltage drop at the sense resistance corresponds to the voltage drop between the first and second terminal of the power FET.

For example, in various embodiments, the regulator circuit has a first FET being a scaled version of the power FET, wherein a first terminal of the first FET is connected to the first terminal of the power FET, wherein a gate terminal of the first FET is configured to be driven with the drive signal of the power FET, wherein the switch-on resistance of the first FET represents the sense resistance. In this case, the sensor circuit may include:

- an operational amplifier, wherein a first input terminal of the operational amplifier is connected to the second terminal of the power FET and a second input terminal of the operational amplifier is connected to a second terminal of the first FET, and
- a variable current source configured to generate a first current as a function of the signal at an output terminal of the operational amplifier, wherein the first current generated by the variable current source is applied to the second terminal of the first FET, whereby the operational amplifier regulates via the variable current source the voltage at the second terminal of the first FET to the voltage at the second terminal of the power FET and the first current flows through the first FET, the first current being proportional to the current flowing through the power FET.

For example, the variable current source may comprise a second FET, wherein the gate terminal of the second FET is connected to the output terminal of the operational amplifier. The variable current source may also include a current mirror configured to apply the current generated by the second FET to the second terminal of the first FET.

Accordingly, as mentioned before, in various embodiments, the first current flowing though the sense resistance is proportional to the current flowing through the power FET. Accordingly, a measurement circuit may be configured to provide a second current corresponding to the first current or being proportional to the first current. For example, the variable current source may directly provide the second current, or the measurement circuit may include: a third FET, wherein the gate terminal of the third FET is connected to the output terminal of the operational amplifier, or a further current mirror configured to generate the second current by mirroring the current generated by the second FET.

In various embodiments, the sensor circuit is thus configured to monitor this second current. Specifically, in various embodiments, the sensor circuit includes a resistor and a first electronic switch configured to selectively apply the second current to the resistor as a function of a first control signal.

In various embodiments, a low pass filter is configured to generate a low-pass filtered signal by filtering a voltage at the resistor, a voltage follower configured to generate a replicate of the low-pass filtered signal, and a second electronic switch configured to selectively apply the replicate of the low-pass filtered signal to the resistor.

Specifically, in various embodiments, a control circuit is configured to:
- when the power FET is closed, close the first electronic switch and open the second electronic switch, whereby the voltage at the resistor is proportional to the instantaneous value of the current flowing through the power FET, and
- when the power FET is opened, open the first electronic switch and close the second electronic switch, whereby the voltage at the resistor corresponds to the low-pass filtered signal, and wherein the low-pass filtered signal is proportional to the average value of the current flowing through the power FET during the periods when the power FET is closed.

For example, in this way, the control circuit may be configured to use two measurement phases. Specifically, during the first measurement phase, the control circuit may be configured to:
- when the power FET is closed, close the first electronic switch and open the second electronic switch, whereby the voltage at the resistor is proportional to the instantaneous value of the current flowing through the power FET, and
- when the power FET is opened, open the first electronic switch and close the second electronic switch, whereby the voltage at the resistor corresponds to the low-pass filtered signal, and wherein the low-pass filtered signal is proportional to the average value of the current flowing through the power FET during the periods when the power FET is closed.

Conversely, during the second measurement phase, the control circuit may be configured to maintain opened the second electronic switch, and:
- when the power FET is closed, close the first electronic switch, and
- when the power FET is opened, open the first electronic switch, wherein the low-pass filtered signal is proportional to the average value of the current flowing through the power FET during the periods when the power FET is closed as well as opened.

For example, such a sensor system may be used in an electronic power converter. For example, in various embodiments, the electronic power converter comprises two input terminals for receiving an input voltage and two output terminals for providing a regulated output voltage or a regulated output current. A switching circuit is connected between the two input terminals and the two output terminals, wherein the switching circuit comprises at least one inductance, and a first power FET and a second power FET configured to control a current flowing through the inductance.

In various embodiments, a control circuit is configured to generate control signals for the first power FET and a second power FET, wherein the control circuit is configured to operate the inductance of the electronic power converter in Continuous-Conduction Mode by driving the first power FET and a second power FET with switching cycles including: a first phase, wherein the first power FET is closed and the second power FET is opened, wherein the current flowing through the inductance increase linearly, and a second phase, wherein the first power FET is opened and the second power FET is closed, wherein the current flowing through the inductance decrease linearly.

Accordingly, in this case, the sensor circuit according to the present disclosure may be used to monitor a current flowing through the first power FET or the second power FET, whereby (as will be described in greater detail in the following) the low-pass filtered signal is proportional to the average value of the current flowing through the inductance.

In various embodiments, the first power FET is implemented with a first plurality of parallel FETs and the second power FET is implemented with a second plurality of parallel FETs. In this case, the control circuit may be configured to:
 acquire the low-pass filtered signal proportional to the average value of the current flowing through the power FET during the periods when the power FET is closed;
 determine a given number of FETs to be closed as a function of the low-pass filtered signal proportional to the average value of the current flowing through the power FET during the periods when the power FET is closed;
 during the first phase, close the given number of FETs of the first plurality of parallel FETs; and
 during the second phase, close the given number of FETs of the second plurality of parallel FETs.

Additionally or alternatively, the control circuit may also use the signals generated by the sensor circuit to control the electronic power converter. For example, in various embodiments, the sensor circuit is configured to monitor a current flowing through the first power FET, and the control circuit may be configured to start the second phase when the voltage at the resistor reaches a given threshold value.

Alternatively, the control circuit may be configured to vary the duration of the first phase and/or the second phase as a function of the average value of the current flowing through the power FET during the periods when the power FET is closed as well as opened.

A sensor circuit for a power FET is also disclosed herein. The sensor circuit is configured to monitor a current flowing through the power FET and includes a sense resistance and a regulator circuit configured to regulate a first current flowing through the sense resistance, such that the voltage drop at the sense resistance corresponds to the voltage drop between the first and second terminal of the power FET. A measurement circuit is configured to provide a second current corresponding to the first current or being proportional to the first current.

In particular, the sensor circuit comprises a resistor, a first electronic switch configured to selectively apply the second current to the resistor as a function of a first control signal, and a low pass filter configured to generate a low-pass filtered signal by filtering a voltage at the resistor. The sensor circuit comprises further a voltage follower configured to generate a replicate of the low-pass filtered signal, and a second electronic switch configured to selectively apply the replicate of the low-pass filtered signal to the resistor.

When the power FET is closed, a control circuit closes the first electronic switch and opens the second electronic switch, whereby the voltage at the resistor is proportional to the instantaneous value of the current flowing through the power FET. Conversely, when the power FET is opened, the control circuit opens the first electronic switch and closes the second electronic switch, whereby the voltage at the resistor corresponds to the low-pass filtered signal, and wherein the low-pass filtered signal is proportional to the average value of the current flowing through the power FET during the periods when the power FET is closed.

BRIEF DESCRIPTION OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
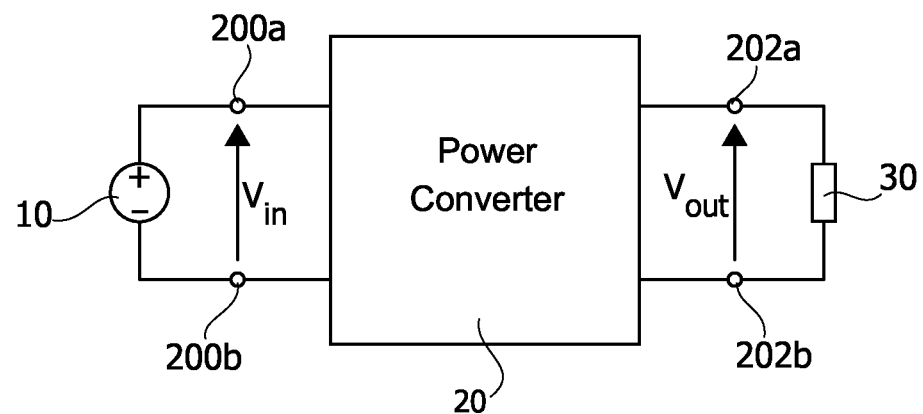
FIG. 1 shows an example of a known electronic power converter.
Figure 2:
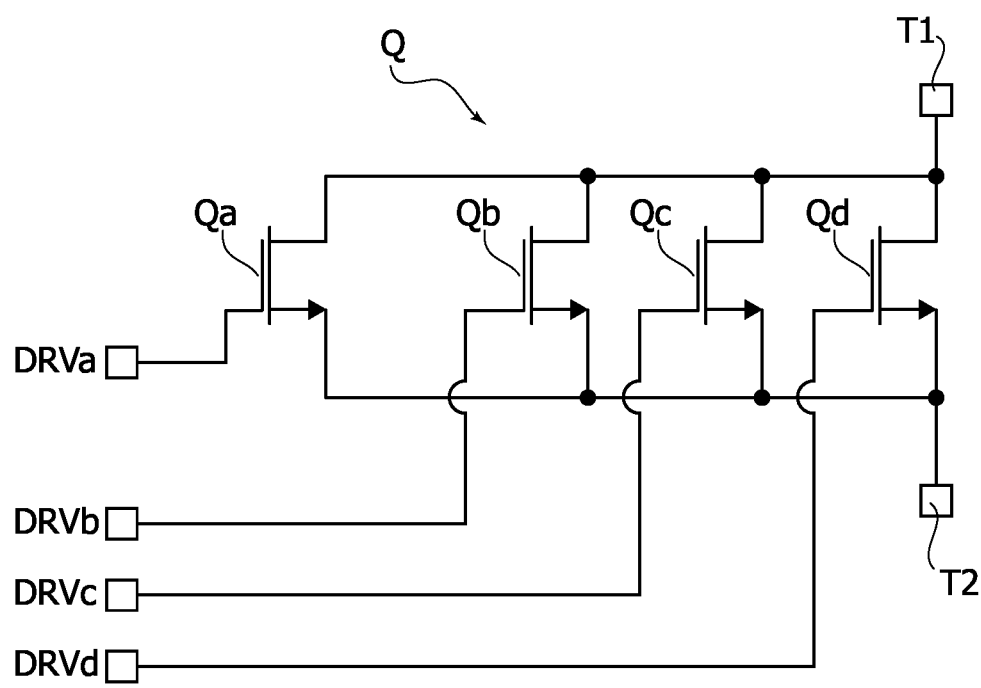
FIG. 2 shows an example of the implementation of a known power switch with a plurality of parallel FETs.

In the following FIGS. 3 to 16 parts, elements, or components which have already been described with reference to FIGS. 1 and 2 are denoted by the same references previously used in such Figures; the description of such previously described elements will not be repeated in the following in order not to overburden the present detailed description.

As mentioned before, the present description relates to approaches for monitoring current flows in an electronic power converter, e.g., for performing a partitioning of one or more electronic switches of the electronic power converter.

Figure 3:
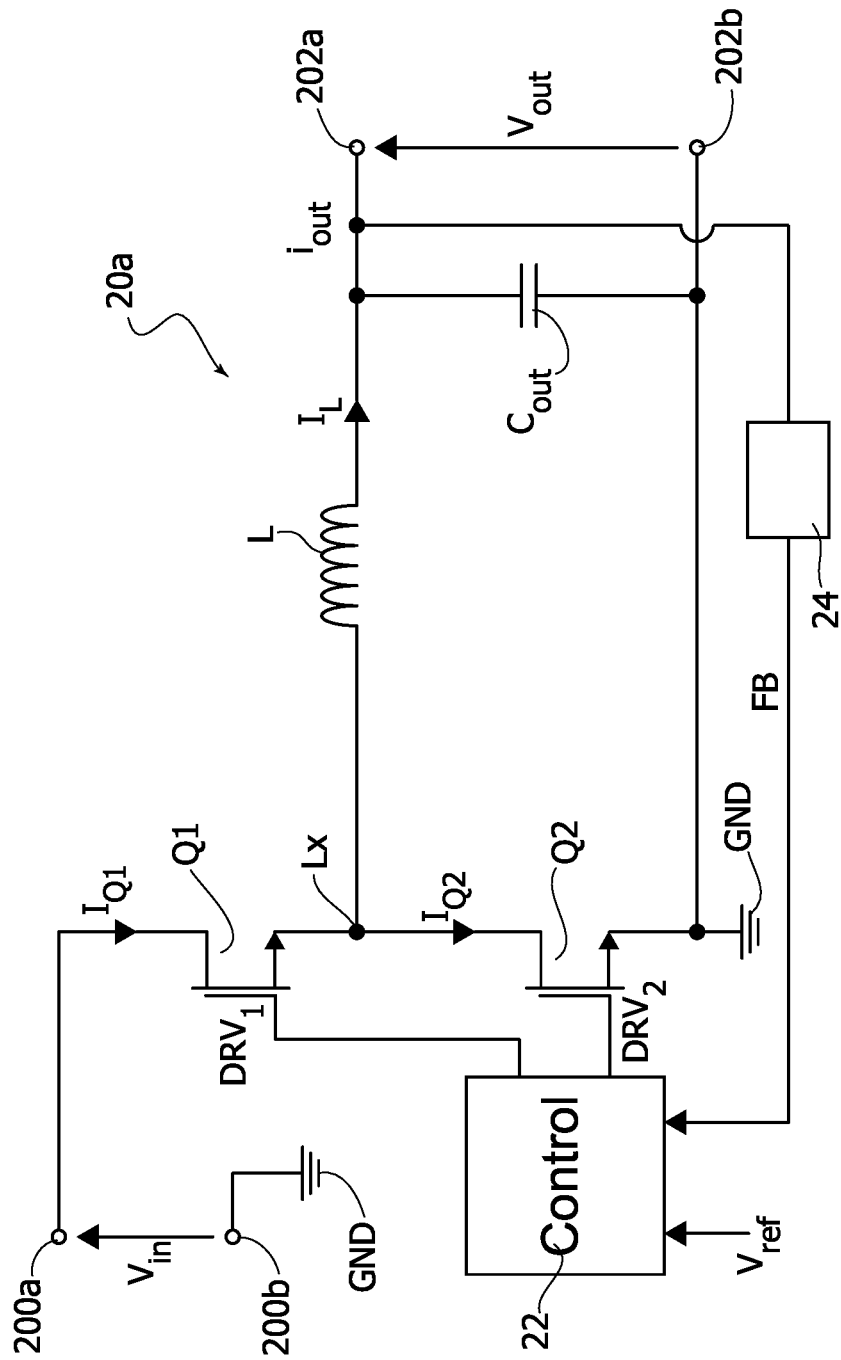
FIG. 3 shows an embodiment of a buck converter disclosed herein.

FIG. 3 shows the circuit schematic of an embodiment of a buck converter 20a. In particular, a buck converter 20a comprises two input terminals 200a and 200b for receiving a DC input voltage $V_{in}$ and two output terminals 202a and 202b for supplying a regulated voltage $V_{out}$, where the output voltage is equal to or lower than the input voltage $V_{in}$.

In the embodiment considered, the buck converter 20a comprises two electronic switches Q1 and Q2 (with the current paths thereof) connected (e.g., directly) in series between the input terminals 200a and 200b, wherein the intermediate node between the electronic switches Q1 and Q2 represents a switching node Lx. Specifically, the electronic switch Q1 is a high-side switch connected (e.g., directly) between the (positive) terminal 200a and the switching node Lx, and the electronic switch Q2 is a low-side switch connected (e.g., directly) between the switching node Lx and the (negative) terminal 200b, which often represents a ground GND. The (high-side) switch Q1 and the (low-side) switch Q2 hence represent a half-bridge configured to connect the switching node Lx to the terminal 200a (voltage $V_{in}$) or the terminal 200b (ground GND).

In various embodiments, the switches Q1 and/or Q2 are transistors, such as Field-Effect Transistors (FETs), such as Metal-Oxide-Semiconductor Field-Effect Transistors (MOSFETs), e.g., n-channel FETs, such as NMOS transistors. Frequently, the second electronic switch Q2 is also implemented just with a diode, where the anode is connected to the terminal 200b and the cathode is connected to the switching node Lx.

In the example considered, an inductance L, such as an inductor, is connected (e.g., directly) between the switching node Lx and the (positive) output terminal 202a. Instead, the (negative) output terminal 202b is connected (e.g., directly) to the (negative) input terminal 200b.

In the example considered, to stabilize the output voltage $V_{out}$, the converter 20 typically comprises a capacitor Cout connected (e.g., directly) between the output terminals 202a and 202b.

Figure 4:
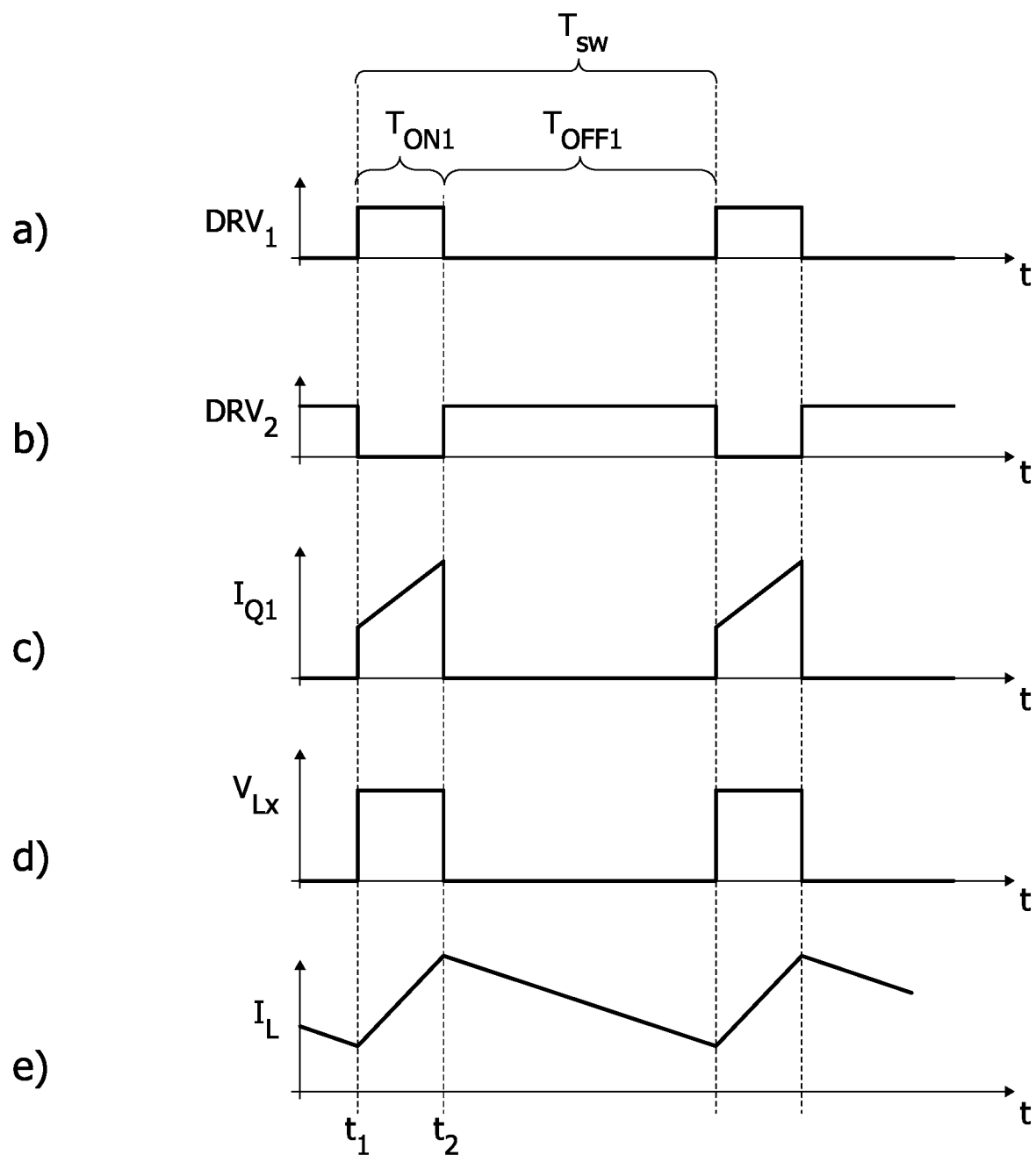
FIG. 4 shows exemplary waveforms of the operation of the converter of FIG. 3.

In this context, FIG. 4 shows exemplary waveforms of the signals of such an electronic power converter, where:

FIG. 4a shows the signal $DRV_1$ for switching the electronic switch Q1;

FIG. 4b shows the signal $DRV_2$ for switching the second electronic switch Q2;

FIG. 4c shows the current $I_{Q1}$ that traverses the electronic switch Q1;

FIG. 4d shows the voltage $V_{Lx}$ at the switching node Lx (i.e., the voltage at the second switch Q2); and FIG. 4e shows the current $I_L$ that traverses the inductor L.

In particular, when the electronic switch Q1 is closed at an instant $t_1$ (ON state), the current $I_L$ in the inductor L increases (substantially) linearly. The electronic switch Q2 is at the same time opened. Instead, when the electronic switch Q1 is opened after an interval $T_{ON1}$ at an instant $t_2$ (OFF state), the electronic switch Q2 is closed, and the current $I_L$ decreases (substantially) linearly. Finally, the switch Q1 is closed again after an interval $T_{OFF1}$. In the example considered, the switch Q2 is hence closed when the switch Q1 is open, and vice versa. The current $I_L$ may thus be used to charge the capacitor Cout, which supplies the voltage $V_{out}$ at the terminals 202a and 202b.

In the embodiment considered, the electronic power converter 20a comprises thus a control circuit 22 configured to drive the switching of the switch Q1 and of the switch Q2, for repeating the intervals $T_{ON1}$ and $T_{OFF1}$ periodically. For example, typically the buck converter 20 comprises also a feedback circuit 24, such as a voltage divider, configured to generate a feedback signal FB indicative of (and preferably proportional to) the output voltage $V_{out}$, and the control circuit 22 is configured to generate the drive signals $DRV_1$ and $DRV_2$ by comparing the feedback signal FB with a reference signal, such as a reference voltage $V_{ref}$.

A significant number of driving schemes are known for generating the drive signals $DRV_1$ and $DRV_2$. These schemes have in common the possibility of regulating the output voltage $V_{out}$ by regulating the duration of the interval $T_{ON1}$ and/or the interval $T_{OFF1}$.

For example, in various embodiments, the control circuit 22 generates a Pulse-Width Modulation (PWM) signal $DRV_1$, wherein the duty cycle $T_{ON1}/(T_{ON1}+T_{OFF1})$ is variable, and the duration of the switching interval $T_{SW}=T_{ON1}+T_{OFF1}$ is constant. For example, a typical control scheme involves that the duration of the interval $T_{ON1}$ is varied via a regulator circuit having at least an integral component, such as a PI (Proportional-Integral) or PID (Proportional-Integral-Derivative) regulator.

In general, a buck converter may be operated in a Continuous-Conduction Mode (CCM), Discontinuous-Conduction Mode (DCM) or Transition Mode (TM). Generally, the control circuit may also be configured to selectively operate the switching stage in a High-Power Mode (HPM) or in a Low-Power Mode (LPM).

Figure 5A:
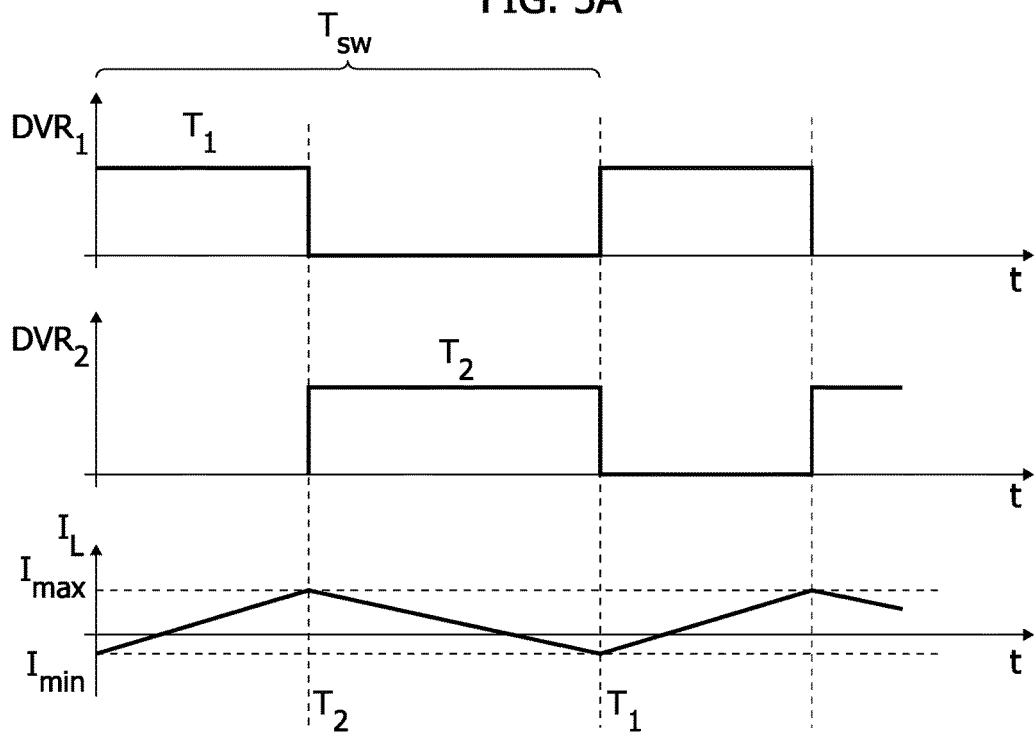
FIG. 5A shows exemplary waveforms when an electronic power converter disclosed herein is operated in CCM.

For example, in the high-power mode, the control circuit 22 may be configured to drive the switches in CCM. As shown in FIG. 5A, when the control circuit 22 operates the converter in CCM, the current $I_L$ flowing through the inductance L has a value different from zero when the switching cycle $T_{SW}$ ends. In this case, the control circuit 22 uses two switching phases $T_1$ and $T_2$, with $T_{SW}=T_1+T_2$, wherein:

during the phase $T_1$ ($T_1=T_{ON1}=T_{OFF2}$) the switch Q1 is closed and the switch/diode Q2 is opened; and during the phase $T_2$ ($T_2=T_{OFF1}=T_{ON2}$) the switch Q1 is opened and the switch/diode Q2 is closed.

In various embodiments, CCM uses a constant frequency PWM modulation. For example, in this case, the instant $t_1$ may be started periodically after a constant time $T_{SW}$. Conversely, the instant $t_2$ may be determined as a function of the feedback signal FB and the reference signal $V_{ref}$, e.g.:

by using a Proportional-Integral (PI) or Proportional-Integral-Derivative (PID) regulator configured to directly vary the duty cycle or the switch-on time $T_{ON1}$ in order to regulate the feedback signal FB to the reference signal $V_{ref}$; or by ending the switch-on interval $T_{ON1}$ when the current $I_L$ flowing through the inductance L (or a value indicative of this current) reaches a maximum threshold value, wherein a PI or PID regulator is configured to vary the maximum threshold value in order to regulate the feedback signal FB to the reference signal $V_{ref}$.

Conversely, in the low-power mode, the control circuit 22 may be configured to drive the switches in a burst mode. Specifically, in this case, the control circuit 22 is configured to alternatively close the electronic switches Q1 and Q2 for one or more cycles, and then both electronic switches are opened. Thus, in this case, the control circuit 22 uses (at least for the last burst) indeed three switching phases $T_1$, $T_2$ and $T_3$, with $T_{SW}=T_1+T_2+T_3$, wherein:

during the phase $T_1$ ($T_1=T_{ON1}$) the switch Q1 is closed and the switch/diode Q2 is opened;

during the phase $T_2$ ($T_2=T_{ON2}$) the switch Q1 is opened and the switch/diode Q2 is closed; and during the phase $T_3$ ($T_{OFF1}=T_2+T_3$ and $T_{OFF2}=T_3+T_1$) the switch Q1 is opened and the switch/diode Q2 is opened.

Figure 5B:
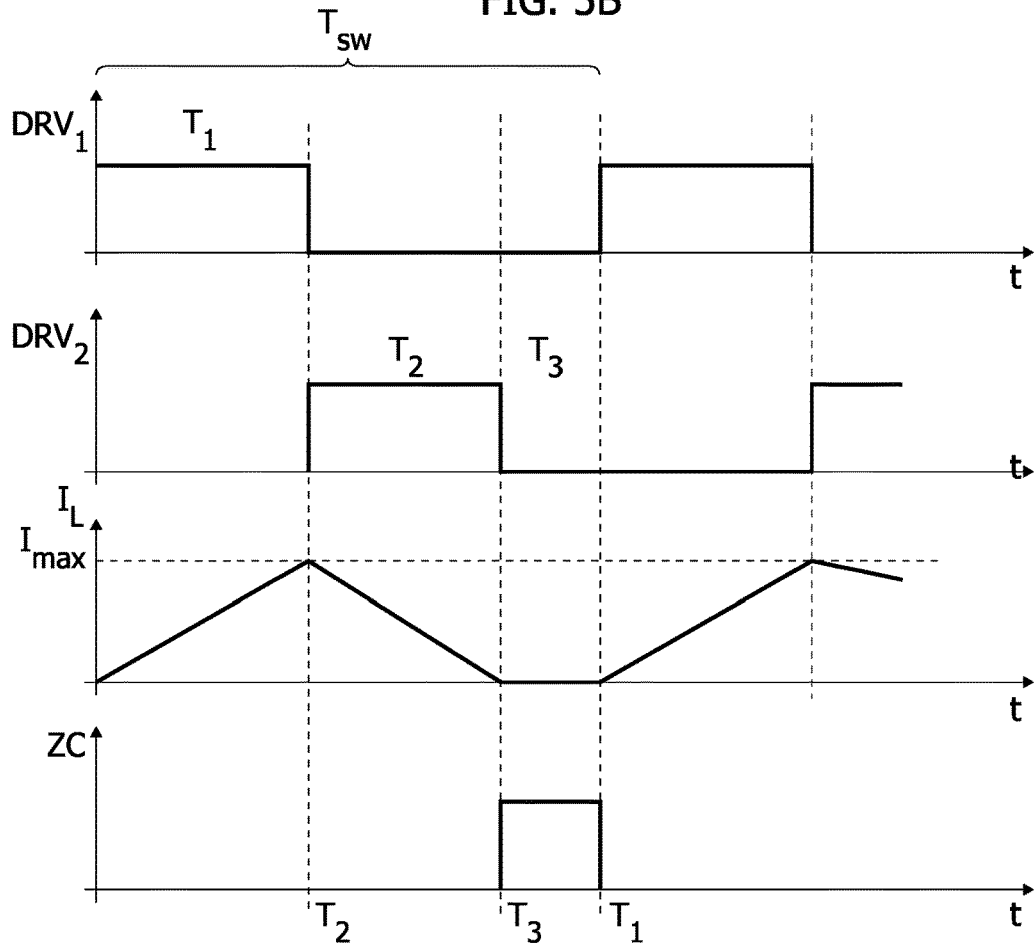
FIG. 5B shows exemplary waveforms when an electronic power converter disclosed herein is operated in DCM.

For example, as shown in FIG. 5B, the control circuit 22 may be configured to:

open the switch Q1 and close the switch Q2 at an instant $t_2$ after a constant switch-on time or after a switch-on time determined as a function of the feedback signal FB;

open the electronic switch Q2 preferably when the current $I_L$ reaches zero at an instant $t_3$, thereby reducing switching losses; and start a new switching cycle at an instant $t_1$ when the feedback signal FB reaches a lower threshold.

For example, the lower threshold may be determined as a function of the reference signal $V_{ref}$ being indicative of the requested output voltage $V_{out}$.

In various embodiments, also (usually fixed) dead times may be introduced between the switching of the drive signals, e.g., between the falling edge of the signal $DRV_1$ and the rising edge of the signal $DRV_2$, and similarly (in CCM mode) between the falling edge of the signal $DRV_2$ and the rising edge of the signal $DRV_1$. Insofar as these intervals are usually short compared to the durations $T_{ON}$ and $T_{OFF}$, these intervals will not be considered specifically in the following.

Thus, essentially, the burst mode may correspond to a special case of DCM, wherein the electronic switch Q2 is opened (and remains opened during the interval $T_3$) when the current $I_L$ reaches zero.

Figure 6:
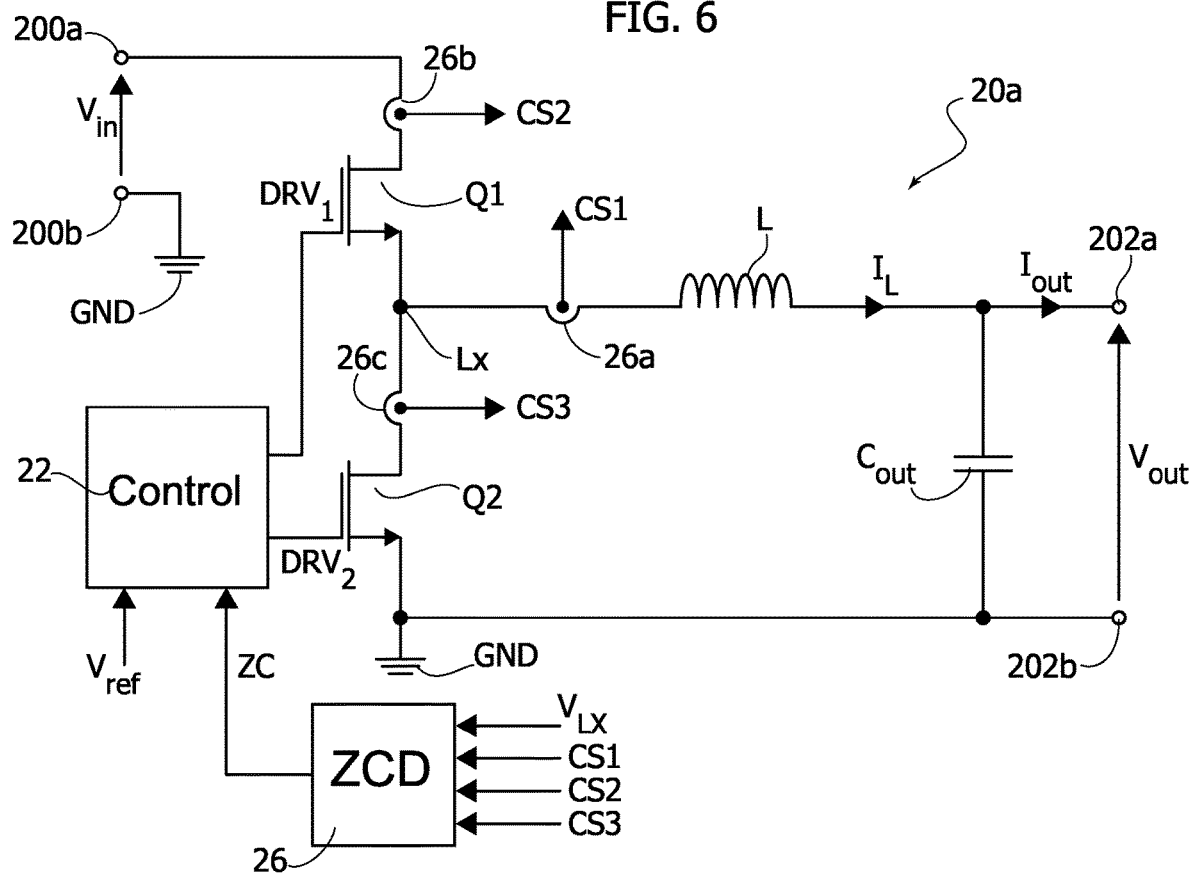
FIG. 6 shows an embodiment of a buck converter comprising one or more current sensors, as disclosed herein.

As shown in FIG. 6, for this purpose, the control circuit 22 may comprise or be connected to a zero-current detection (ZCD) circuit 26 configured to generate a zero-current signal ZC indicating (at least) the instant $t_3$ when the current $I_L$ reaches zero, in particular at least during the interval $T_2$. For example, such a zero-current detection circuit 26 may comprise a current sensor 26a connected directly in series with the inductance L, wherein the current sensor 26a provides a signal CS1 indicative of (and preferably proportional to) the current $I_L$ flowing through the inductance L.

In various embodiments, the current sensor 26a may also be replaced with current sensors 26c connected directly in series with the electronic switch Q2, wherein the current sensor 26c provides a signal CS3 indicative of (and preferably proportional to) the current $I_{Q2}$ flowing through the switch Q2, which corresponds to the current $I_L$ flowing through the inductance L during the interval $T_2$.

For example, the zero-current signal ZC may be determined via a comparator of circuit 26, a so-called zero current comparator, e.g., configured to determine whether the monitored signal CS1 or CS3 falls below a given threshold (which is usually close to zero). For example, in FIG. 5B is shown an example of the zero-current signal ZC, which is set to high when the measured current is smaller than the threshold (close to zero).

Accordingly, in the embodiment considered, the electronic switches Q1 and Q2 are the power switches of the electronic power converter 20a. Accordingly, as described with respect to FIG. 2, such electronic switches Q1 and Q2 may be replaced with a number K of parallel electronic switches or an electronic switch, which may be partitioned into K partitions. In this case, the control circuit 22 is thus configured to generate a respective number K of drive signals (e.g., DRVa-DRVd) for each of the electronic switches Q1 and Q2, which select the number N of electronic switches Qa-Qd which should be closed. For example, in various embodiments, the electronic switches Q1 and Q2 are implemented with the same number of parallel-connected electronic switches Qa-Qd, i.e. $K_1=K_2=K$, and the control circuit 22 is configured to determine a number N of electronic switches Qa-Qd as a function of the measurement signal CS1, CS2 or CS3, and set the numbers $N_1$ and $N_2$ to N, i.e. $N_1=N_2=N$.

For example, in order to close a given number $N_1$ of electronic switches Qa-Qd, the control circuit 22 may set $N_1$ drive signals DRVa-DRVd of the electronic switch Q1 to the drive signal $DRV_1$ described in the foregoing, and the other $K_1$-$N_1$ drive signals DRVa-DRVd of the electronic switch Q1 to the logic level maintaining the respective switch opened (e.g. low). Similarly, in order to close a given number $N_2$ of electronic switches Qa-Qd, the control circuit 22 may set $N_2$ drive signals DRVa-DRVd of the electronic switch Q2 to the drive signal $DRV_2$ described in the foregoing, and the other $K_2$-$N_2$ drive signals DRVa-DRVd of the electronic switch Q2 to the logic level maintaining the respective switch opened (e.g., low).

As mentioned before, for this purpose the control circuit 22 should be able to monitor the average current flowing through each of the electronic switches Q1 and Q2, in particular during the intervals in which the respective electronic switch Q1 or Q2 is closed, i.e., during the interval $T_1$ for the electronic switch Q1 and during the interval $T_2$ for the electronic switch Q2.

For example, this is schematically shown in FIG. 6, wherein the electronic power converter 20a also comprises a current sensor 26b connected directly in series with the electronic switch Q1, wherein the current sensor 26b provides a signal CS2 indicative of (and preferably proportional to) the current flowing through the switch Q1, which corresponds to the current $I_L$ flowing through the inductance L during the interval $T_1$.

Accordingly, in various embodiments, the electronic power converter 20a may comprise:

a current sensor 26b configured to generate a signal CS2 indicative of (and preferably proportional to) the instantaneous value of the current $I_{Q1}$ flowing through the electronic switch Q1, a current sensor 26c configured to generate a signal CS3 indicative of (and preferably proportional to) the instantaneous value of the current $I_{Q2}$ flowing through the electronic switch Q2, and a current sensor 26a configured to generate a signal CS1 indicative of (and preferably proportional to) the instantaneous value of the current $I_L$ flowing through the inductance L.

In various embodiments, the electronic power converter 20a may also comprise a current sensor configured to generate a signal indicative of (and preferably proportional to) the instantaneous value of the current $i_{out}$ provided via the output terminals.

For example, as mentioned before, the average values of the currents $I_{Q1}$ and $I_{Q2}$ may be used to control the partitioning of the power switches Q1 and Q2. Conversely, the (instantaneous and/or average) values of the currents $I_L$ and/or $i_{out}$ may be used to regulate the current $i_{out}$ or voltage $V_{out}$ provided via the output terminals 202a and 202b.

In this respect the inventors have observed that, when the converter is operated in CCM (in steady state, i.e. without load transient), the average value of the current $I_{Q1}$ flowing through the electronic switch Q1 during the interval $T_1$ corresponds to the average value of the current $I_{Q2}$ flowing through the electronic switch Q2 during the interval $T_2$, because the current $I_L$ has a triangular waveform with a linear behavior in each of the intervals $T_1$ and $T_2$. Moreover, the average value of the currents $I_{Q1}$ and $I_{Q2}$ (during the interval $T_1$ and $T_2$, respectively) corresponds to the average value of the current $I_L$ flowing through the inductance L during the intervals $T_1$ and $T_2$. Moreover, in case of a buck converter, the average value of the current $I_L$ corresponds also to the average value of the current $i_{out}$.

Accordingly, in various embodiments, in order to decide the number $N_1$ of electronic switches Qa-Qd of the electronic switch Q1 (which should be switched on during the interval $T_1$) and the number $N_2$ of electronic switches Qa-Qd of the electronic switch Q2 (which should be switched on during the interval $T_2$), and/or to regulate the electronic power converter 20a, the control circuit 22 is configured to monitor (and possibly elaborate) only one of the signals CS1, CS2 and CS3.

Generally, in case the converter 20a may be operated also in DCM, it is preferable to use one of the current sensors 26a or 26c, because these sensors also provide the information of the zero-crossing of the current $I_L$.

Similar issues exist also in other electronic power converters comprising a switching stage with an inductance L and two electronic switches Q1/Q2 configured to control the current flow through the inductance L, whereby the current $I_L$ flowing through the inductance L has a triangular waveform. For example, this applies to various types of half-bridge converters, wherein the inductance L shown in FIG. 3 is replaced with a primary winding of a transformer. In this case, the output terminals are not connected to the capacitance Cout, but the secondary winding of the transformer is connected to the output terminal 202a and 202b via a rectifier and filter circuit.

Figure 7:
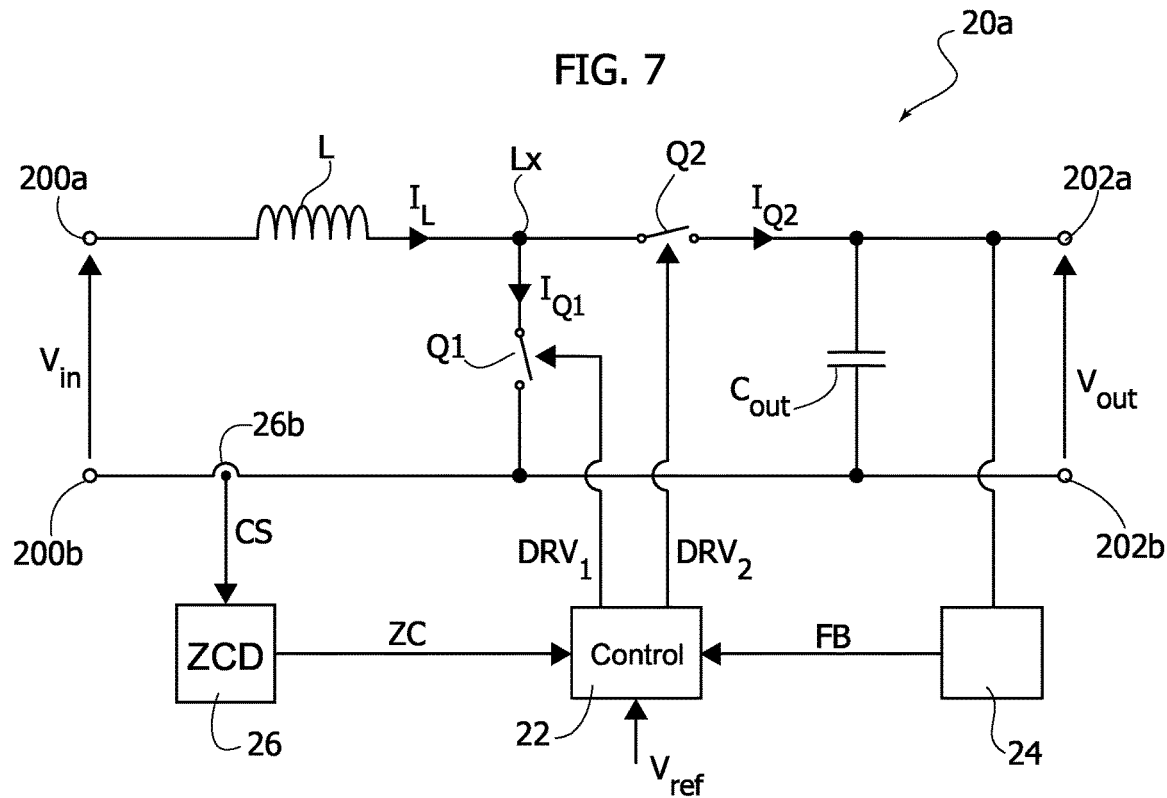
FIG. 7 shows an embodiment of a boost converter disclosed herein.

Other types of electronic power converters adapted to be operated in CCM and having triangular waveforms are boost and buck-boost converters comprising two electronic switches. For example, FIG. 7 shows an example of a boost converter. Specifically, in the example considered, an inductance L, such as an inductor, is connected (e.g., directly) between the positive input terminal 200a and a switching node Lx. The switching node Lx is connected (e.g., directly) via (the current path of) a first electronic switch Q1 to the negative input terminal 200b, which in turn is usually connected (e.g., directly) to the negative output terminal 202b. The switching node Lx is also connected (e.g., directly) via (the current path of) a second electronic switch Q2 to the positive output terminal 202a. Usually a capacitance Cout, such as a capacitor, is connected between the output terminals 202a and 202b.

For example, in CCM, the control circuit 22 may again generate a PWM signal $DRV_1$ for the electronic switch Q1, wherein the duty cycle is determined, e.g., via a PI or PID regulator, as a function of a feedback signal FB and a reference voltage $V_{ref}$. For example, again the feedback signal FB may be provided by a voltage sensor 24 configured to generate a feedback signal FB indicative of (and preferably proportional to) the output voltage $V_{out}$. The control circuit 22 may generate also a signal $DRV_2$ for the electronic switch Q2, which (again neglecting possible dead-times) corresponds to the inverted version of the signal $DRV_1$.

Thus, also in this case the electronic power converter 22a may comprise a current sensor configured to generate a signal indicative of (and preferably proportional to):
- the instantaneous value of the current $I_L$ flowing through the inductance L,
- the instantaneous value of the current $I_{Q1}$ flowing through the electronic switch Q1, or
- the instantaneous value of the current $I_{Q2}$ flowing through the electronic switch Q2.

Specifically, in various embodiments, the control circuit 22 (or directly the current sensor) is configured to process this signal in order to determine:
- the average value of the current $I_L$ flowing through the inductance L,
- the average value of the current $I_{Q1}$ flowing through the electronic switch Q1 when the electronic switch Q1 is closed, or
- the average value of the current $I_{Q2}$ flowing through the electronic switch Q2 when the electronic switch Q2 is closed.

In fact, also in this case, these values correspond. For example, as mentioned before, also in this case the electronic switches Q1 and/or Q2 may be replaced with a plurality of parallel-connected electronic switches, and the control circuit 22 may be configured to determine the number $N_1$ and/or $N_2$ of electronic switches to be closed as a function of one of the previous average values.

In case of a boost converter, it may be useful to monitor the current $I_{Q2}$, because:
- in DCM, the respective measurement signal may be used to determine the zero-current instant of the current $I_L$ flowing through the inductor L; and
- without load transients, the average value of the current $I_{Q2}$ corresponds to the average value of the current $i_{out}$ (for the complete switching cycle).

Alternatively, also the current $I_{Q1}$ may be monitored, because the signal may be used in case of a peak-current regulation, wherein the electronic switch Q1 is opened when the current $I_{Q1}$, and accordingly the current $I_L$, reaches a given (maximum) threshold value. However, similarly, the signal may be used in case of a valley-current regulation, wherein the electronic switch Q2 is opened when the current $I_{Q2}$, and accordingly the current $I_L$, reaches a given (minimum) threshold value.

Accordingly, in various embodiments, the control circuit 22 (or directly the current sensor) is configured to process (via an analog and/or digital circuit) the measurement signal indicative of the instantaneous value of the current flowing through one of the power switches in order to determine at least one of:
- a first average value of the current when the respective power switch is closed; and
- a second average value of the current for the complete switching cycle.

For example, the first average value (which also indicates the average value of the current flowing through the inductance) may be used to control the partitioning of the power switches. Moreover, the instantaneous value and/or the first average value and/or the second average value may be used to control the switching operation of the electronic power converter 20a.

Thus, in general, embodiments herein relate to a control circuit 22 for an electronic power converter 22a comprising a switching stage with an inductance L and two electronic switches Q1/Q2 configured to optimize the power loss thanks to the measurement of the current flow through the inductance L in CCM, wherein the current $I_L$ flowing through the inductance L has a triangular waveform, or the measurement of the current $i_{out}$.

Figure 8:
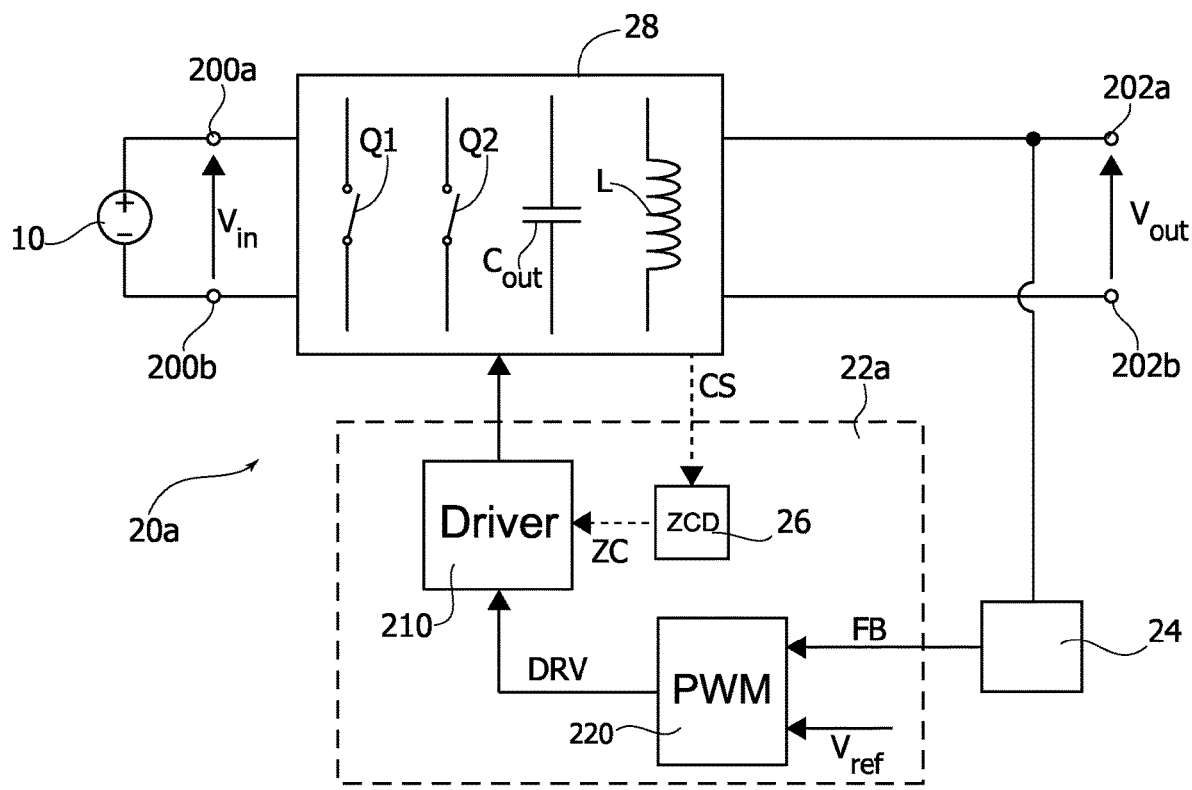
FIGS. 8 and 9 show an embodiment of a electronic power converter disclosed herein.

This is also shown in FIG. 8. Specifically, in the embodiment considered, the electronic power converter 20a comprises a switching stage/circuit 28 connected between input terminals 200a, 200b and output terminal 202a, 202b. Such a switching stage 28 comprises at least one inductance L, such as an inductor or transformer, and at least two electronic switches Q1 and Q2 configured to control the current $I_L$ flowing through the inductance L. Optionally the switching stage 28 comprises also at least one capacitor Cout. For example, in a buck converter (FIG. 3) or boost converter (FIG. 7), these components are the electronic switch Q1, the electronic switch Q2, the inductance L and the capacitance Cout.

As described in the foregoing, the switching stage 28 is configured such that the current flowing through the inductance L may be controlled (via the electronic switches Q1 and Q2) in CCM.

For example, as shown in FIG. 5A, in CCM, the control circuit 22 uses two switching phases $T_1$ and $T_2$, with $T_{SW}=T_1+T_2$, wherein:
during the phase $T_1$ ($T_1=T_{ON1}=T_{OFF2}$) the switch Q1 is closed and the switch Q2 is opened; and
during the phase $T_2$ ($T_2=T_{OFF1}=T_{ON2}$) the switch Q1 is opened and the switch Q2 is closed.

Generally, it is not particularly relevant for the embodiments described herein how these phases are managed. For example, as described in the foregoing, the duration of the switching cycle $T_{SW}$ may be constant and the switch-on duration $T_{ON1}$ may be determined via a PI or PID regulator configured to regulate the difference between a reference signal $V_{ref}$ and a feedback signal FB provided by a feedback circuit 24, wherein the feedback signal FB is indicative of the output voltage $V_{out}$ between the terminals 202a/202b.

Figure 9:
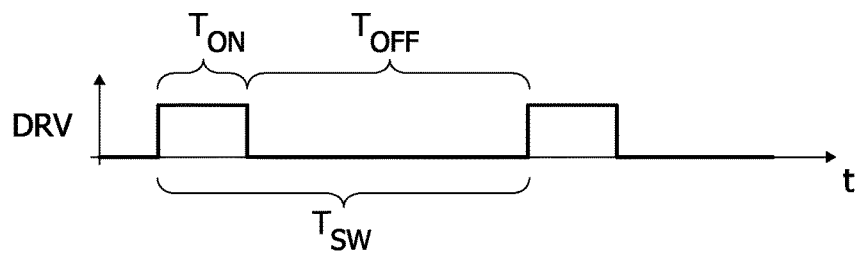

For example, this is schematically shown via a PWM generator circuit 220 configured to generate a PWM signal DRV, which has switching cycles $T_{SW}$ (e.g., with fixed or predetermined period) wherein the signal DRV is set to a first logic level (e.g., high) for a first duration $T_{ON}$ and to a second logic level (e.g., low) for a second duration $T_{OFF}$, with $T_{SW}=T_{ON}+T_{OFF}$ (see also FIG. 9). For example, the circuit 220 may be an analog and/or digital PI or PID regulator configured to vary the switch-on duration $T_{ON}$ in order to regulate the difference between the reference signal $V_{ref}$ and the feedback signal FB to zero.

Accordingly, in this case, a driver circuit 210 may be configured to detect rising and falling edges in the drive signal DRV, and
in response to a rising edge in the drive signal DRV, set (e.g., immediately) the signal $DRV_2$ for the electronic switch Q2 to low and set (e.g., after a first dead time) the signal $DRV_1$ for the electronic switch Q1 to high; and
in response to a falling edge in the drive signal DRV, set (e.g., immediately) the signal $DRV_1$ to low and set (e.g., after a second dead time) the signal $DRV_2$ to high.

Thus, also in this case the electronic switches Q1 and/or Q2 may be replaced with $K_1$ and/or $K_2$ parallel-connected electronic switches, and the control circuit 22 may be configured to determine the number $N_1$ and/or $N_2$ of electronic switches to be closed as a function of:
the average value of the current $I_L$ flowing through the inductance L,
the average value of the current $I_{Q1}$ flowing through the electronic switch Q1 when the electronic switch Q1 is closed, or
the average value of the current $I_{Q2}$ flowing through the electronic switch Q2 when the electronic switch Q2 is closed.

The inventors have observed that directly measuring the current $I_L$ flowing through the inductance L via a shunt resistor connected in series with the inductance usually is not convenient, because the resistor may not be easily integrated in an integrated circuit comprising the control circuit 22a and additional power losses are generated by such a shunt resistor.

In the following will thus be described embodiments wherein the control circuit 22a is configured to measure the current flowing through one of the electronic switches Q1 or Q2, and then determine the control parameter $N_1$ and/or $N_2$ as a function of the average current flowing through this electronic switch while the electronic switch is closed.

For example, FIG. 10 shows again an embodiment of a boost converter. Specifically, in line with the description of FIG. 7, the boost converter comprises two input terminals 200a and 200b for receiving a DC input voltage $V_{in}$ and two output terminals 202a and 202b for providing a regulated voltage $V_{out}$ or a regulated current $i_{out}$, wherein the negative output terminal 202b is connected (e.g., directly) to the negative input terminal 200b, which represents a ground GND.

In the embodiment considered, an inductor L and a p-channel FET Q2, such as a PMOS, are connected (e.g., directly) in series between the positive input terminal 200a and the positive output terminal 202a. Specifically, a first terminal of the inductor L is connected (e.g., directly) to the terminal 200a, a second terminal of the inductor L is connected (e.g., directly) to the drain terminal of the transistor Q2 (identified in the following again as node Lx), and the source terminal of the transistor Q2 is connected (e.g., directly) to the terminal 202a.

In the embodiment considered, an electronic switch Q1 is connected (e.g., directly) between the node Lx (intermediate point between the inductor L and the transistor Q2) and ground GND. For example, the electronic switch Q1 may be a transistor, such as a n-channel FET, e.g., an NMOS. Specifically, this electronic switch Q1 is configured to selectively connect the node Lx to ground GND.

In various embodiments, a capacitor COUT may be connected (e.g., directly) between the output terminals 200a and 202b.

As described in the foregoing, in various embodiments, the electronic switches Q1 and Q2 may be implemented with a plurality (physical or virtual) electronic switches connected in parallel, e.g., a plurality of $K_1$ n-channel FET for the switch Q1 and a plurality of $K_2$ p-channel FET for the switch Q2. As mentioned before, the gate terminals of the transistor Q1 and the gate terminal of the transistor Q2 are driven by respective drive signals, schematically indicated as $DRV_1$ and $DRV_2$ even though indeed a plurality of $K_1$ and $K_2$ of drive signals may be used, which are generated by the control circuit 22a (not shown in FIG. 10).

In the embodiment considered, the electronic power converter also comprises a sensor circuit 26 configured to generate a signal S indicative of the current $I_{Q2}$ flowing through the p-channel transistor Q2 or a reference transistor of the plurality of transistors Q2. Specifically, the reference transistor Q2 corresponds to one of the $N_2$ (with $1 \leq N_2 \leq K_2$) transistors Q2, which is closed during the interval $T_2$ by the control circuit 22a. For example, the reference transistor may be fixed, and e.g., correspond to the first transistor Qa.

For example, in the embodiment considered, the sensor circuit 26 is implemented in line with the description of U.S. Pat. No. 10,644,599 (incorporated by reference). Specifically, the sensor circuit 26 comprises a p-channel FET Q3. Specifically, in various embodiments, the p-channel FET Q3 corresponds to a scaled version of the p-channel FET Q2 or the respective reference FET. Specifically, in various embodiments, the ratio W/L (width to length) of the transistors Q2 and Q3 is scaled. For example, in various embodiments, the length L of the transistors Q2 and Q3 corresponds, but the width W is different. However, generally, also the length L could be varied or both parameters could be varied. For example, for this purpose, the sensor circuit 26 and the p-channel FET or FETs Q2 may be integrated within the same integrated circuit. For example, in the context of a boost converter, the switch Q1, the transistor Q2, the control circuit 22a and the sensor circuit 26 may be implemented in an integrated control IC.

In the embodiment considered, the sensor circuit 26 further comprises an operational amplifier 260, a variable current source 262, and a current mirror 264. Specifically, in the embodiment considered, the non-inverting/positive terminal (or generally a first input terminal) of the operational amplifier 260 is connected (e.g., directly) to the source terminal of the transistor Q2 or the respective reference FET. Conversely, the inverting/negative terminal (or generally a second input terminal) of the operational amplifier 260 is connected (e.g., directly) via the p-channel FET Q3 to the drain terminal of the transistor Q2 or the respective reference FET. Specifically, in the embodiment considered, the source terminal of the transistor Q3 is connected to the inverting/negative terminal of the operational amplifier 260 and the drain terminal of the transistor Q3 is connected to the drain terminal of the transistor Q2 or the respective reference FET. Finally, the drive signal applied to the gate terminal of the transistor Q3 corresponds to:
- the drive signal $DRV_2$ of the transistor Q2 (in case of a single transistor Q2), or
- a drive signal of the respective reference transistors Q2 (in case of a plurality of transistor Q2).

In the embodiment considered, the output of the operational amplifier 260 drives the variable current generator 262, which thus is configured to generate a current $I_G$ as a function of the signal at the output of the operational amplifier 260.

Specifically, in case of a boost converter, the second/source terminal of the transistor Q2 or the respective reference FET is connected to the output terminal 202a, and thus to the regulated voltage $V_{OUT}$. Accordingly, the variable current source 262 may be powered via the voltage $V_{OUT}$, i.e. the source terminal of the transistor Q2. However, another regulated voltage may also be used to supply the variable current source 262.

For example, in the embodiment considered, the variable current source 262 is implemented with a p-channel FET Q4, such as a PMOS. Specifically, in the embodiment considered, the source terminal of the transistor Q4 is connected (e.g., directly) to the source terminal of the transistor Q2 or the respective reference FET (i.e., to the voltage $V_{OUT}$) and the gate terminal is connected to the output of the operational amplifier 260. Accordingly, the drain terminal of the transistor Q4 will provide a current $I_G$ being determined as a function of (e.g., at least in part proportional to) the signal at the output of the operational amplifier 260.

In the embodiment considered, the variable current $I_G$ generated by the current generator 262 (e.g., the current provided via the drain terminal of the transistor Q4) is applied, e.g., via the current mirror 264, to the source terminal of the transistor Q3.

For example, in the embodiment considered, the current mirror 264 is connected to ground GND and is thus implemented with a current mirror comprising two n-channel FETs Q5 and Q6, such as NMOS. Specifically, in the embodiment considered, the drain terminal of the transistor Q5 is connected to the output of the current generator 262, e.g., the drain terminal of the transistor Q4, the source terminal of the transistor Q5 is connected to ground GND, and the gate terminal of the transistor Q5 is connected to the drain terminal of the transistor Q5. Conversely, the gate terminal of the transistor Q6 is connected to the gate terminal of the transistor Q5, the source terminal of the transistor Q6 is connected to ground GND, and the drain terminal of the transistor Q6 is connected to the source terminal of the transistor Q3.

Thus, in various embodiments, the sensor circuit 26, e.g., via the current mirror 264, is configured to impose the current $I_G$ generated by the variable current generator 262 also on the transistor Q3.

Accordingly, the sensor circuit 26 is configured to implement a feedback loop of the current $I_G$ provided by the current source 262. Specifically, the operational amplifier 260 is configured to vary, via this feedback loop, the current $I_G$ generated by the current generator 262 in order to keep the voltage V− at the inverting/negative input of the operational amplifier 260 equal to the voltage V+ at the non-inverting/positive input of the operational amplifier 260. Thus, in the stable condition (V+=V−), the voltage $V_{DS3}$ between the drain and source terminals of the transistor Q3 corresponds to the voltage $V_{DS2}$ between the drain and source terminals of the transistor Q2 or the respective reference FET.

However, due to the scaling of the transistor Q2 or the respective reference FET with respect to the transistor Q3, but a fraction of the current $I_{Q2}$ flowing through the transistor Q2 or the respective reference transistor will flow through the transistor Q3, i.e., the current $I_S$ flowing through the transistor Q3 is proportional to the current $I_{Q2}$ flowing through the transistor Q2 or the respective reference transistor:

$$I_S = I_{Q2}/M \qquad (2)$$

Thus, in various embodiments, knowing the number $N_2$ (i.e., the number of switches which are close for the switch Q2), the control circuit 22a may also calculate the total current flowing through the $N_2$ closed transistors.

Generally, also the current mirror 264 may perform a scaling, i.e., the current $I_G$ provided by the current generator 262 may not necessarily be identical to the current $I_S$, but may merely be proportional to the current $I_S$.

Thus, in order to determine a value indicative of (and preferably proportional to) the instantaneous value of the current $I_{Q2}$ flowing through the transistor Q2, the sensor circuit 26 may comprise a measurement circuit configured to measure, e.g.:

the current $I_S$ flowing through the transistor Q3 (e.g., corresponding to the current flowing through the output of the current mirror 264); and/or the current $I_G$ provided by the variable current generator 262 (e.g., corresponding to the current flowing through the input of the current mirror 264).

For example, in the embodiment considered, the sensing measurement circuit comprises a variable current generator 268 configured to generate a variable current $I_D$ as a function of the current $I_G$, which is thus proportional to the current $I_{Q2}$.

For example, in the embodiment considered and similar to the current generator 262, the variable current generator 268 is p-channel FET, such as a PMOS. Specifically, in the embodiment considered, the source terminal of the transistor Q7 is connected to the source terminal of the transistor Q2 (i.e., to the voltage $V_{OUT}$) and the gate terminal is connected to the gate terminal of the transistor Q4. Accordingly, in the embodiment considered, the p-channel FETs Q4 and Q7 are driven by the same gate-source voltage and thus provide the same current (or again the currents $I_G$ and $I_D$ are at least proportional). Accordingly, the drain terminal of the transistor Q7 will provide a current $I_D$ being proportional to the instantaneous value of the current $I_{Q2}$ flowing through the transistor Q2 or the respective reference transistor.

Accordingly, the sensing/measurement signal S may correspond to the current $I_D$. In case the sensing signal S should be a voltage signal, the sensing means 266 may also comprise a current-voltage converter 270, such as e.g., a resistor RD connected (e.g., directly) between the output of the variable current generator 268, e.g., the drain terminal of the transistor Q7, and ground GND. Accordingly, in the embodiment considered, the voltage VD at the resistor RD will be proportional to the current IM flowing through the transistor Q2 or the respective reference transistor.

In various embodiments, a chopper circuit 272 may be associated with the operational amplifier 260. Specifically, the chopper circuit 272 is configured to switch the input and the output terminals of the operational amplifier 260 in order to move the offset of the operation amplifier 260 at a higher frequency with respect to the signal frequency. The operation of such a chopper circuit 272 is known in the art, e.g., from R. Wu et al., Precision Instrumentation Amplifiers and Read-Out Integrated Circuits, "Chapter 2—Dynamic Offset Cancellation Techniques for Operational Amplifiers", Analog Circuits and Signal Processing, DOI: 10.1007/978-1-4614-3731-4_2, Springer Science+Business Media New York 2013, the contents of which are incorporated by reference. Generally, the chopper circuit 272 may also be integrated in the operational amplifier 260.

Specifically, in the embodiment considered, the chopper circuit 272 is configured to perform the chopping operation based on a signal CHOP. For example, in various embodiments, the signal CHOP may be provided by the control circuit 22a. For example, in various embodiments, the CHOP may be a pulsed signal, which is periodically set for a duration $T_{SW1}$ (i.e., one switching cycle of the switch Q2) to a first logic level and then for a duration $T_{SW1}$ (i.e., one switching cycle of the switch Q2) to a second logic level.

Accordingly, by switching the input and output terminals of the operational amplifier 260, the chopper circuit 260 moves the offset of the operation amplifier 260 at a higher frequency with respect to the signal frequency. Accordingly, in the embodiment considered, the offset of the operational amplifier 260 will be modulated with the frequency $F_{chop}$ of the signal CHOP, which e.g., may be $F_{chop}=1/(2\ T_{SW1})$. Accordingly, in various embodiments, the sensor circuit 26 and/or the control unit 22a may comprise a filter 274 configured to filter the sensed signal S, e.g., the current $I_D$ or the voltage $V_D$, in order to remove the frequency $F_{chop}$.

For example, this filter 274 may be an analog low-pass or band-pass filter having an upper frequency being smaller than the minimum frequency $F_{chop}$ of the signal CHOP.

For example, in the embodiment considered, an analog low-pass filter 274 is connected between the signal S and ground, i.e., in parallel with the current-voltage converter 270, whereby the voltage $V_D$ already represents a filtered signal, in which the modulated offset of the operational amplifier 260 has been removed. For example, in the embodiment considered, a passive low pass filter 274 is implemented by connecting a capacitor $C_D$ in parallel with the resistor $R_D$.

Figure 10:
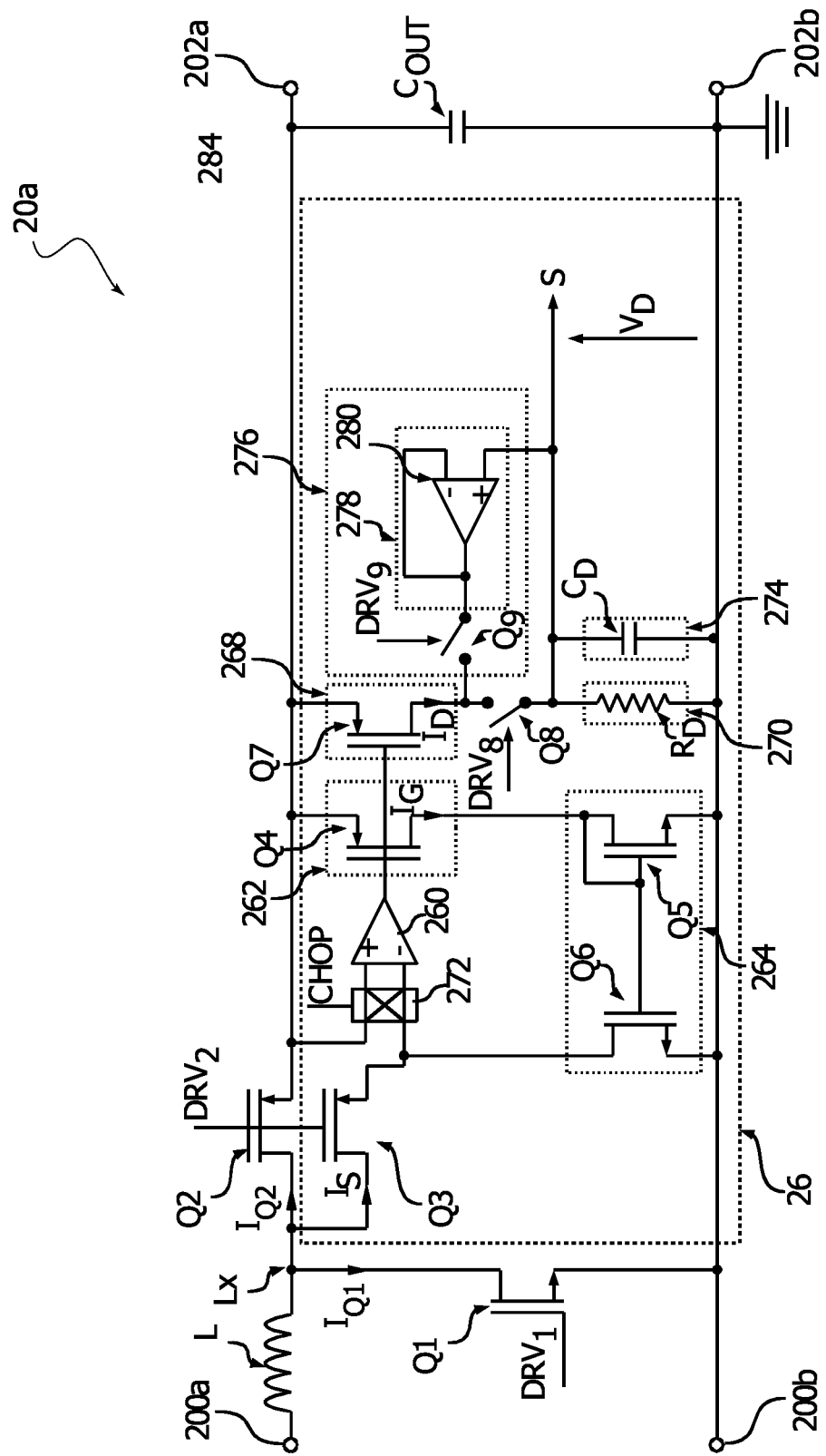
FIG. 10 shows an embodiment of a sensor circuit configured to measure the current flowing through an electronic switch of a boost converter, as disclosed herein.

The sensor circuit 26 of FIG. 10 is able to monitor the current IM also for small voltage drops between the drain and source terminal of the transistor Q2, which (for low power applications) may be in the range of 1 to 5 mV, for a typical switch on resistance of 50 mΩ of the transistor Q2.

In various embodiments, an electronic switch Q8 is connected between the current generator 268 and the filter and current-voltage conversion circuit 270/274.

In various embodiments, the control circuit 22a may also generate a drive signal $DRV_8$ for the switch Q8 in order to:

a) close the switch Q8 when the transistor Q2 or the respective reference transistor is closed and current is flowing through the transistor Q2 or the respective reference transistor (interval $T_2$), and b) open the switch Q8 when the transistor Q2 or the respective reference transistor is opened (interval $T_1$).

However, when the switch Q8 is opened, the output terminal of the variable current generator 268 would in principle be floating. However, due to parasitic capacitances Cpar at the output of the current generator 268, the voltage at the output terminal will usually increase. For example, in the embodiment considered, the voltage of the drain terminal of the transistor Q7 may increase essentially up to the output voltage $V_{OUT}$. When the switch Q8 is closed again, the filter and current-voltage conversion circuit 270/274 will again be connected to the output terminal of the current generator 268.

For example, in the embodiment considered, the parasitic capacitances Cpar will transfer in this moment a charge $Q_{par}$ to the filter and current-voltage conversion circuit 270/274, corresponding, e.g., to:

$$Q_{par}=Cpar(V_{OUT}-V_D)$$

In case the current $I_D$ is high, this parasitic charge $Q_{par}$ may be neglected. Conversely, in practical implementations, the current $I_D$ should be as small as possible in order to reduce the electrical losses. Accordingly, in this case, the parasitic charge $Q_{par}$ could significantly vary the voltage $V_D$.

Accordingly, in various embodiments a stabilizer circuit 276 is configured to impose the voltage $V_D$ at the output terminal of the current generator 268, when the switch Q8 is opened (interval $T_1$).

For example, in various embodiments, the stabilizer circuit 276 comprises a voltage follower 278 configured to provide at its output the voltage $V_D$. For example, in the embodiment considered, the voltage follower 278 is implemented with an operational amplifier 280 which receives at the non-inverting/positive input terminal the voltage $V_D$ and the output terminal of the operational amplifier 280 is connected to the inverting/negative input terminal of the operational amplifier 280. The stabilizer circuit 276 comprises moreover an electronic switch Q9 configured to selectively connect the output terminal of the voltage follower 278/operational amplifier 280 to the output terminal of the current generator 268.

Accordingly, in various embodiments, the switch Q9 is closed when the switch Q8 is opened, and the switch Q9 is opened when the switch Q8 is closed. For example, in various embodiments, the control circuit 22a may also generate a drive signal $DRV_9$ for the switch Q9.

U.S. Pat. No. 10,644,599 also mentions that the filter 274 could be used to directly obtain the mean value of the signal S and thus the mean value of the current $I_{Q2}$. However, as described in the foregoing, the control circuit 22a may be able to determine the average value of the current $I_{Q2}$ for the periods when the electronic switch Q2 is closed. In fact, this value is also indicative of the current flowing through the inductance L. As described in the foregoing, the control circuit 22a may be configured to determine the numbers $N_1$ and $N_2$ as a function of the average value of the current $I_{Q2}$ during the time when the switch Q2 is closed.

However, the inventors have observed that the approach shown in FIG. 10 is not appropriate when the control circuit should be able to measure the average value of the current $I_L$. In fact, as described in the foregoing, the average value of the current $I_L$ may be determined by determining the average value of the current $I_{Q2}$, during the periods when the electronic switch Q2 is closed.

For example, as described in the foregoing, the control circuit 22a may be configured to determine the numbers $N_1$ and $N_2$ as a function of this average value.

However, measuring the average value of the current flowing through the inductance L may also be useful to optimize the efficiency curve of the DC-DC, since the switching losses of the DC-DC are dependent on the coil current. For example, this is rather evident in the context of a boost converter. Specifically, when considering a static condition with constant average values for $V_{out}$ and $i_{out}$, the current $I_L$ changes as a function of the input voltage $V_{in}$.

Figure 11:
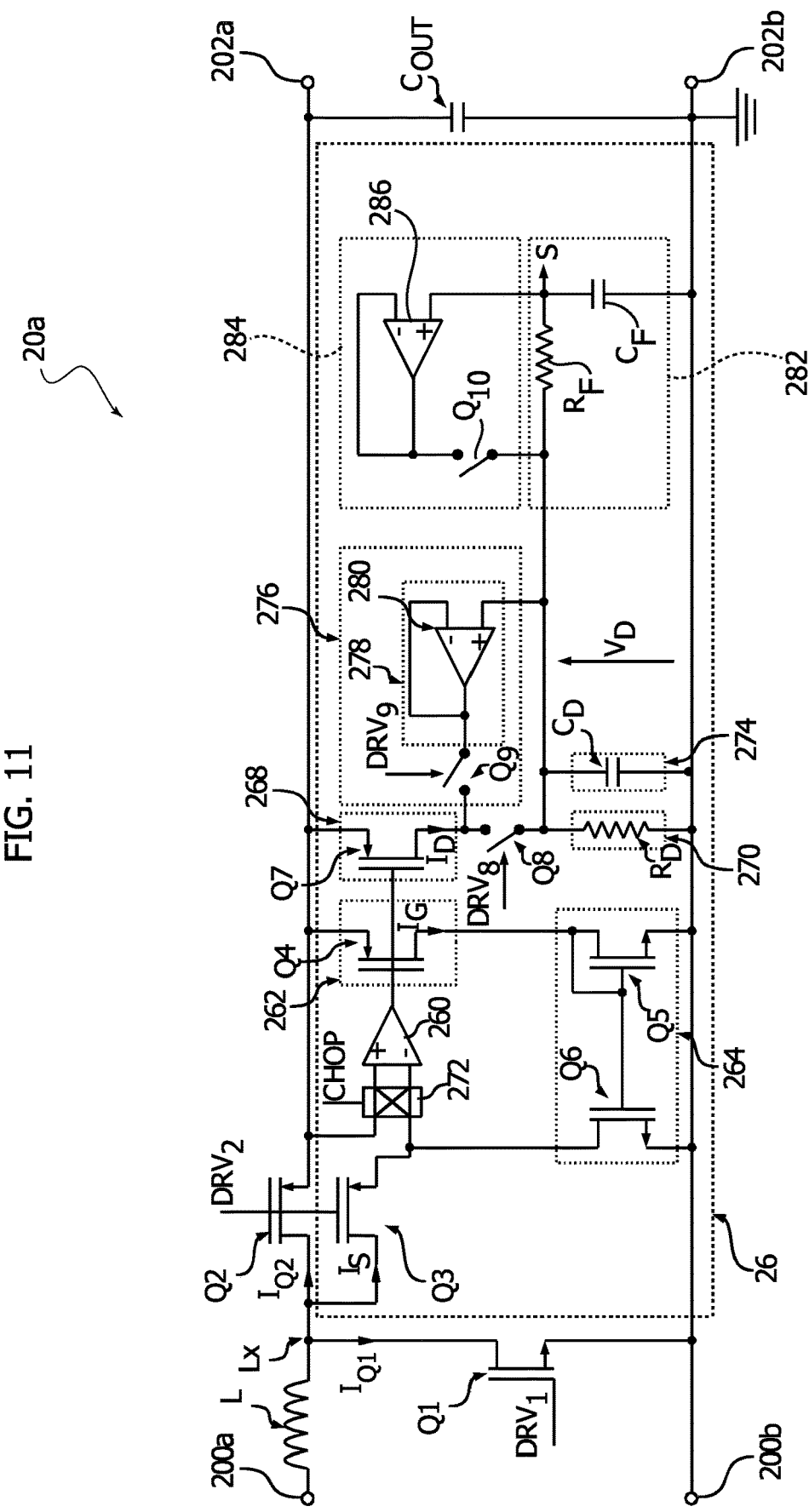
FIG. 11 shows an embodiment of a sensor circuit configured to measure the average current flowing through the inductance of a boost converter, as disclosed herein.

Accordingly, FIG. 11 shows a further embodiment, wherein the filter 274 is small, thereby providing essentially a voltage $V_D$ proportional to the instantaneous value of the current $I_D$ when the electronic switch Q8 is closed (interval $T_2$). Moreover, an additional low pass filter 282 and an additional voltage follower 286 have been added.

Specifically, the low pass filter 282, e.g., comprising a resistor $R_F$ and a capacitor $C_F$ connected in series, receives at input the voltage $V_D$ and provides at output (e.g., at the terminals of the capacitor $C_F$) the low-pass filtered version of the voltage $V_D$ corresponding to the signal S. Moreover, the voltage follower 284, e.g., implemented with an operational amplifier 286, receives at input the low-pass filtered version of the voltage $V_D$ corresponding to the signal S (e.g., at the voltage at the capacitor $C_F$). In the embodiment considered, the voltage at the output of the voltage follower 284 is selectively applied via an electronic switch Q10 to the filter and current-voltage conversion circuit 270/274.

Specifically, in various embodiments, the control circuit 22a is configured to open the electronic switch Q10 when the electronic switch Q8 is closed (interval $T_2$) and close the electronic switch Q10 when the electronic switch Q8 is opened (interval $T_1$).

Thus, in the embodiment considered, the voltage follower 284, the electronic switch Q10 and the capacitor $C_F$ also implement a sample-and-hold circuit.

Figure 12:
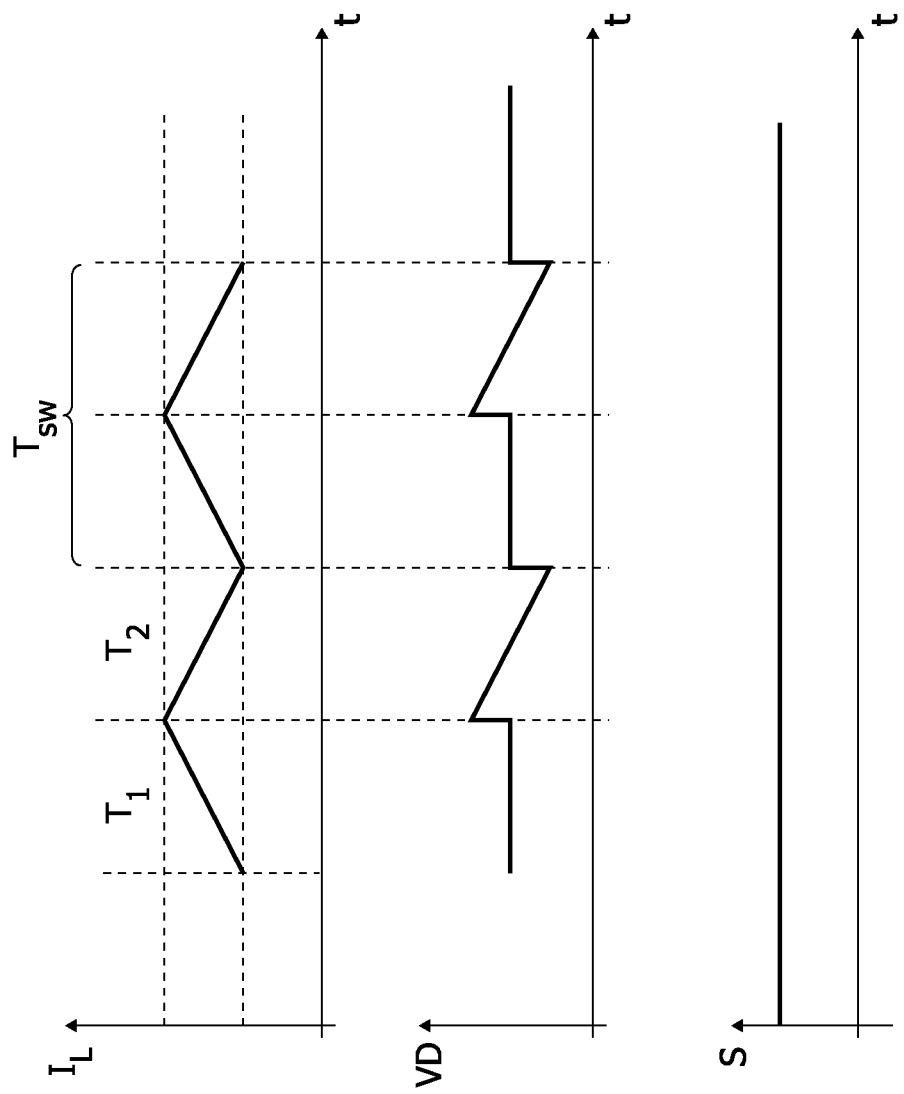
FIG. 12 shows exemplary waveforms of the operation of the sensor circuit of FIG. 11.

Specifically, as shown in FIG. 12, when the control circuit 22a closes the electronic switch Q2 (interval $T_2$), the control circuit 22a also closes the electronic switch Q8 and opens the electronic switch Q10. Accordingly, the voltage $V_D$ provided by the filter and current-voltage conversion circuit 270/274 is proportional to the (instantaneous value of the) current $I_{Q2}$ flowing through the transistor Q2 or the respective reference transistor.

Conversely, when the control circuit 22a opens the electronic switch Q2 (interval $T_1$), the control circuit 22a also opens the electronic switch Q8 and closes the electronic switch Q10. Accordingly, thanks to the buffer 284, the voltage $V_D$ is kept at the voltage S.

Accordingly, with this driving, the signal S corresponds to the average value of the current $I_{Q2}$ during the periods when the switch Q2 is closed. As mentioned before, this value corresponds also to the average value of the coil current $I_L$ flowing through the inductance L.

In various embodiments, the control circuit 22a may also directly measure the voltage $V_D$, which is proportional to the (instantaneous value of the) current $I_{Q2}$. For example, this signal may be used to control the switching of the electronic switches Q1 and Q2.

Additionally or alternatively, in line with the description of FIG. 10, the control circuit 22a may also maintain the switch Q10 as always being opened, wherein the signal S corresponds to the average value of the current $I_{Q2}$ during the complete switching cycle. For example, in case of a boost converter, this value corresponds to the average value of the current $i_{out}$. For example, in various embodiments, the control circuit 22a may be configured to use two measurement phases:

during a first phase (comprising a plurality of switching cycles $T_{SW}$) the control circuit 22a also switches the switch Q10 (Q10 is opened when the switch Q2 is closed, and vice versa), thereby acquiring the average value of the coil current $I_{Q2}$; and during a second phase (comprising a plurality of switching cycles $T_{SW}$) the control circuit 22a maintains opened the switch Q10, thereby acquiring the average value of the output current $i_{out}$ in case of a boost converter.

Generally, the described approach may also be used to measure the average current when the electronic switch is a low-side n-channel FET, e.g., the electronic switch Q2 of the buck converter shown in FIG. 3, or the electronic switch Q1 of the boost converter shown in FIG. 7.

Figure 13:
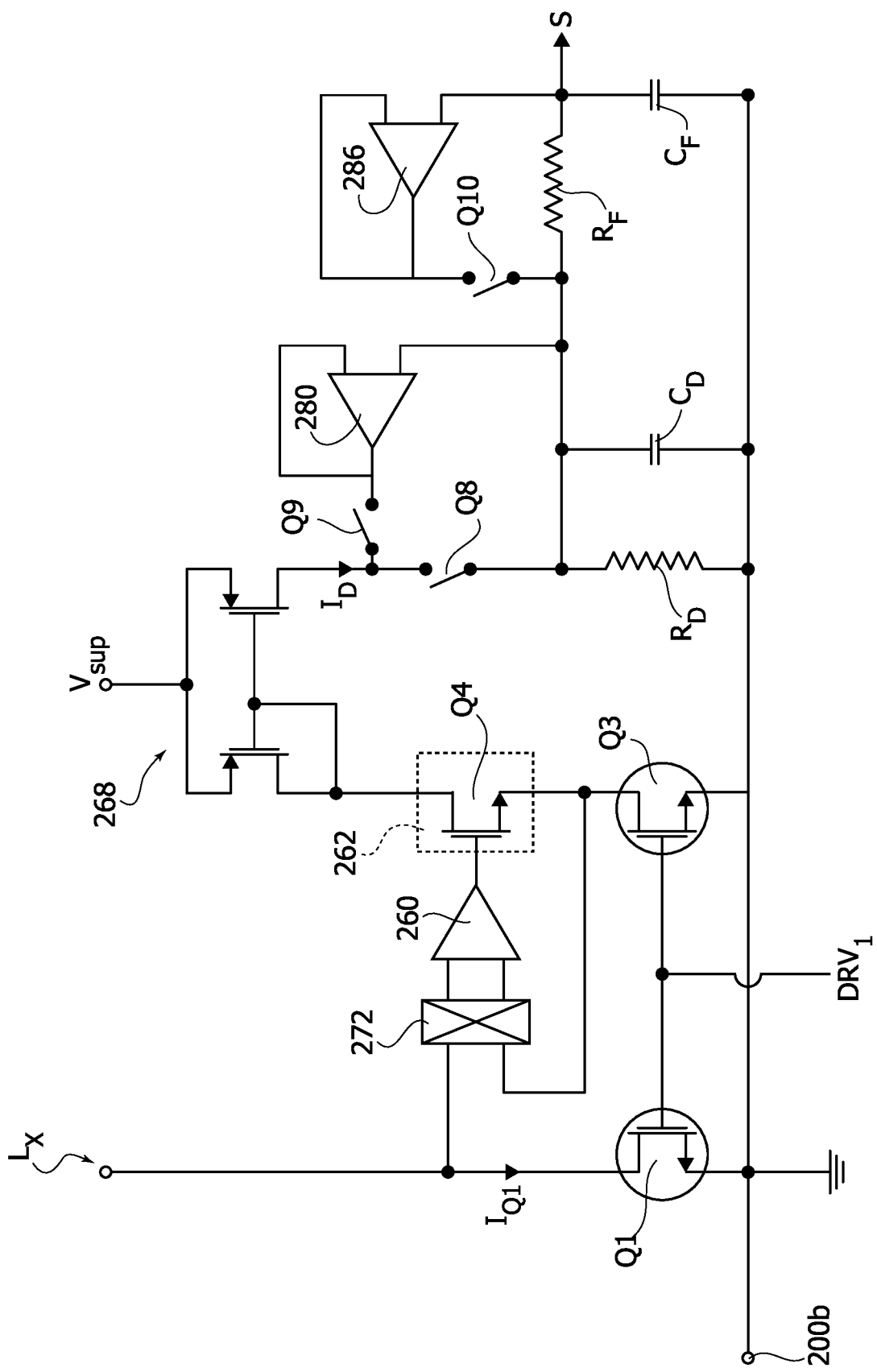
FIG. 13 shows an embodiment of a sensor circuit configured to measure the average current flowing through the inductance of a buck or boost converter, as disclosed herein.

For example, FIG. 13 shows a sensor circuit 26 for the low-side electronic switch Q1 of the boost converter. Specifically, also in this case the electronic power converter comprises a power switch, indicated as Q1, which may be implemented with a FET or a plurality of $K_1$ FETs connected in parallel, wherein one of the FETs represents a reference transistor. The FET or reference FET comprises a gate terminal, and a first and a second terminal (drain and source) defining the current path of the FET.

Specifically, the sensor circuit 26 comprises a FET Q3 that is a scaled version of the FET Q1 or the respective reference FET, wherein the first terminal of the FET Q3 is connected to the first terminal of the FET Q1 or the respective reference FET and the gate terminal of the FET Q3 is configured to be driven with the drive signal $DRV_1$ of the FET Q1 or the respective reference FET. Specifically, in the embodiment considered, the first terminal of the FET Q1 (or the respective reference FET) and the FET Q3 are the source terminals.

In the embodiment considered, the sensor circuit 26 comprises an operational amplifier 260, wherein a first input terminal of the operational amplifier 260 is connected to the second terminal of the (power) FET Q1 or the respective reference FET and a second input terminal of the operational amplifier 260 is connected to a second terminal of the FET Q3. Specifically, in the embodiment considered, the second terminal of the FET Q1 (or the respective reference FET) and the FET Q3 are the drain terminals.

In the embodiment considered, a variable current source 262, e.g., implemented with a n-channel FET, is configured to generate a current as a function of the signal at an output terminal of the operational amplifier 260, wherein the current is applied to the second terminal of the FET Q3. Specifically, in this case, the current mirror 264 has been omitted.

Accordingly, the operational amplifier 260 regulates, via the variable current source 262, the voltage at the second terminal of the FET Q3 to the voltage at the second terminal of the (power) FET Q1 and a current flows through the FET Q3, which is proportional to the current flowing through the (power) FET Q1 or the respective reference transistor.

In the embodiment considered, the sensor circuit comprises a measurement circuit configured to generate a measurement signal indicative of the current flowing through the (power) FET by monitoring (the instantaneous value of) the current flowing through the FET Q3 and/or the current generated by the variable current source 262.

For example, in the embodiment considered, the measurement circuit comprises a current mirror 268, wherein the input of the current mirror 268 receives the current generated by the variable current source 262, and the output provides the current $I_D$ proportional to the current flowing through the FET Q1 or the respective reference transistor when the FET Q1 or the respective reference transistor is closed.

Accordingly, the measurement circuit may comprise the other components described with respect to FIG. 11 (270, 274, Q8, 276, 282, 284, Q10) for determining a signal S being proportional to the average value of the current $I_{Q1}$ when the electronic switch Q1 is closed, which thus corresponds to the average coil current.

In various embodiments, the sensor circuit shown in FIG. 13 may also comprise a chopper circuit 272 associated with the operational amplifier, wherein the chopper circuit is configured to switch the input and possibly also the output terminals of the operational amplifier as a function of a chopping control signal, thereby moving the offset of the operation amplifier at a higher frequency with respect to the signal frequency, i.e., the frequency of the chopping control signal.

Figure 14:
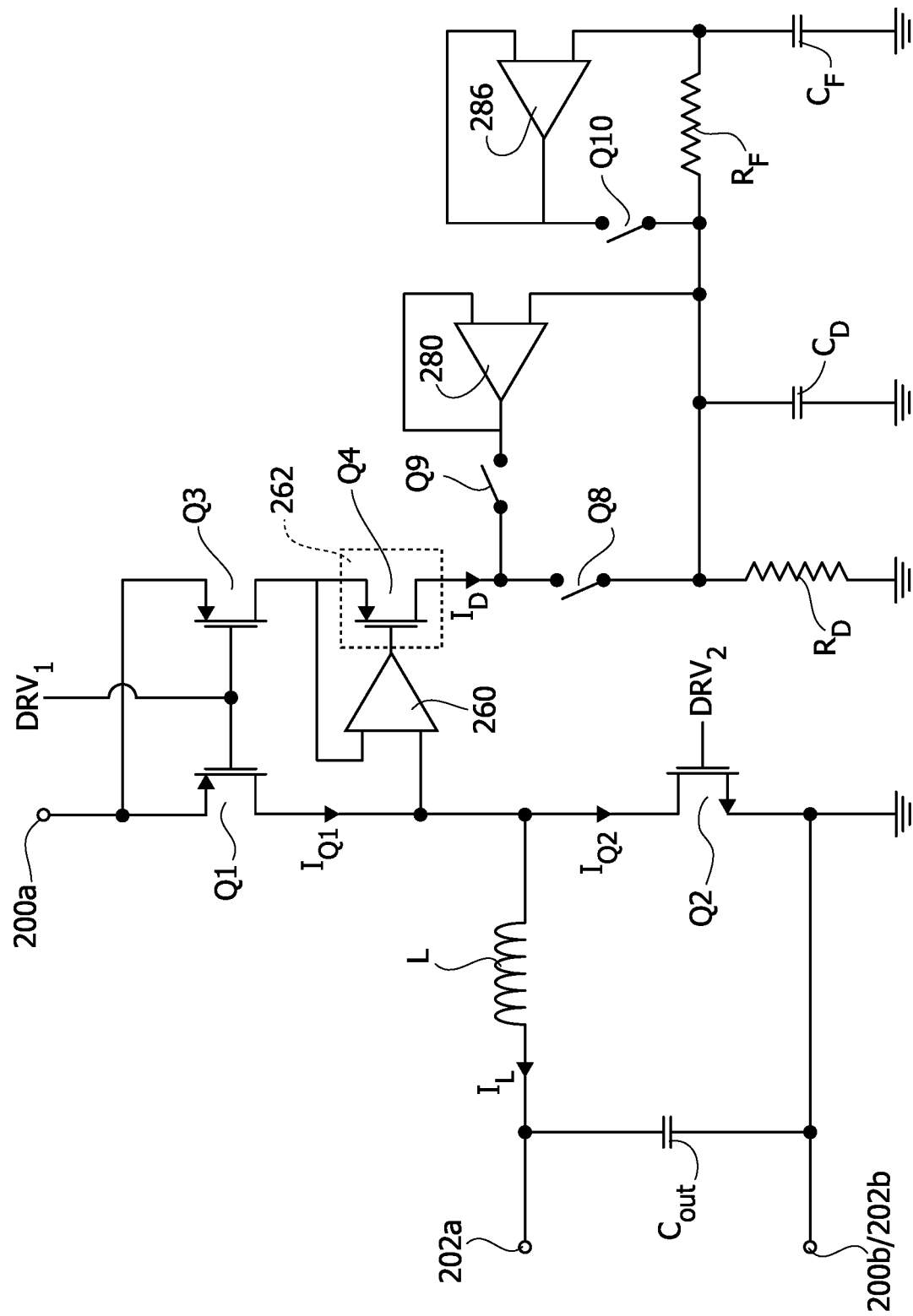
FIG. 14 shows an embodiment of a sensor circuit configured to measure the average current flowing through the inductance of a buck converter, as disclosed herein.

FIG. 14 shows a further embodiment, which e.g., may be used to determine the average current flowing through a high side p-channel FET Q1, e.g., of the buck converter shown in FIG. 3.

Specifically, also in this case the electronic power converter comprises a power switch Q1, which may be implemented with a FET or a plurality of $K_1$ FETs connected in parallel, wherein one of the FETs represents a reference transistor. The FET Q1 or reference FET comprises a gate terminal, and a first and a second terminal (drain and source) defining the current path of the FET.

Specifically, the sensor circuit 26 comprises a FET Q3 that is a scaled version of the FET Q1 or the respective reference FET, wherein the first terminal of the FET Q3 is connected to the first terminal of the FET Q1 or the respective reference FET and the gate terminal of the FET Q3 is configured to be driven with the drive signal $DRV_1$ of the FET Q1 or the respective reference FET. Specifically, in the embodiment considered, the first terminal of the FET Q1 (or the respective reference FET) and the FET Q3 are the source terminals.

In the embodiment considered, the sensor circuit 26 comprises an operational amplifier 260, wherein a first input terminal of the operational amplifier 260 is connected to the second terminal of the (power) FET Q1 or the respective reference FET and a second input terminal of the operational amplifier 260 is connected to a second terminal of the FET Q3. Specifically, in the embodiment considered, the second terminal of the FET Q1 (or the respective reference FET) and the FET Q3 are the drain terminals.

In the embodiment considered, a variable current source 262, e.g., implemented with a p-channel FET, is configured to generate a current as a function of the signal at an output terminal of the operational amplifier 260, wherein the current is applied to the second terminal of the FET Q3. Specifically, in this case, the current mirror 264 has again been omitted.

Accordingly, the operational amplifier 260 regulates again, via the variable current source 262, the voltage at the second terminal of the FET Q3 to the voltage at the second terminal of the (power) FET Q1 and a current flows through the FET Q3, the current flowing through the FET Q3 being proportional to the current flowing through the (power) FET Q1 or the respective reference transistor.

In the embodiment considered, the sensor circuit comprises a measurement circuit configured to generate a measurement signal S indicative of the current flowing through the (power) FET Q1 by monitoring (the instantaneous value of) the current flowing through the FET Q3 and/or the current generated by the variable current source 262.

For example, in the embodiment considered, the current generator 262 directly provides the current $I_D$ proportional to the current flowing through the FET Q1 or the respective reference transistor when the FET Q1 or the respective reference transistor is closed.

Accordingly, the measurement circuit may comprise the other components described with respect to FIG. 11 (270, 274, Q8, 276, 282, 284, Q10) for determining a signal S being proportional to the average value of the current $I_{Q1}$ when the electronic switch Q1 is closed, which thus corresponds to the average coil current.

Figure 15:
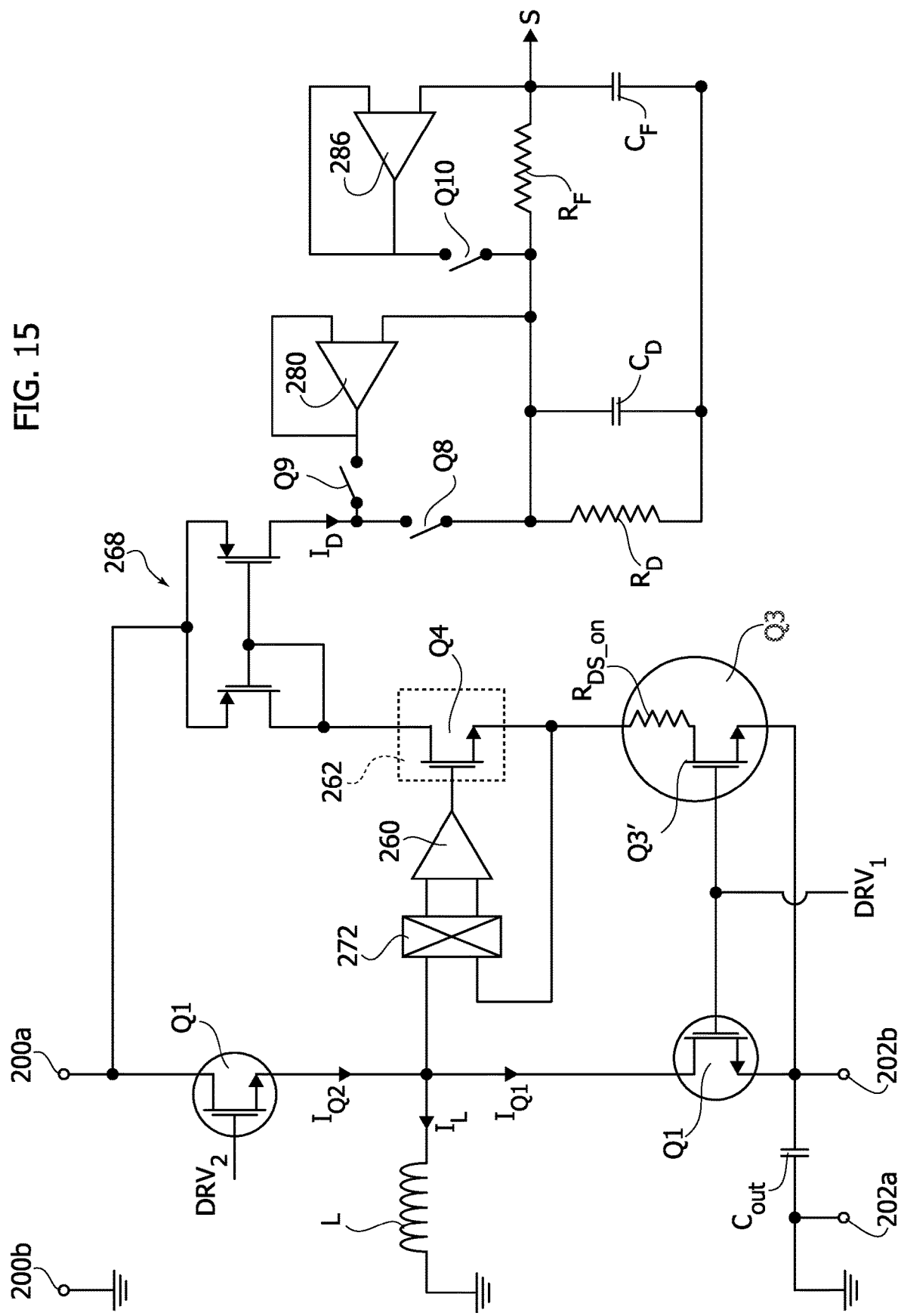
FIG. 15 shows a first embodiment of a sensor circuit configured to measure the average current flowing through the inductance of a buck-boost converter, as disclosed herein.
Figure 16:
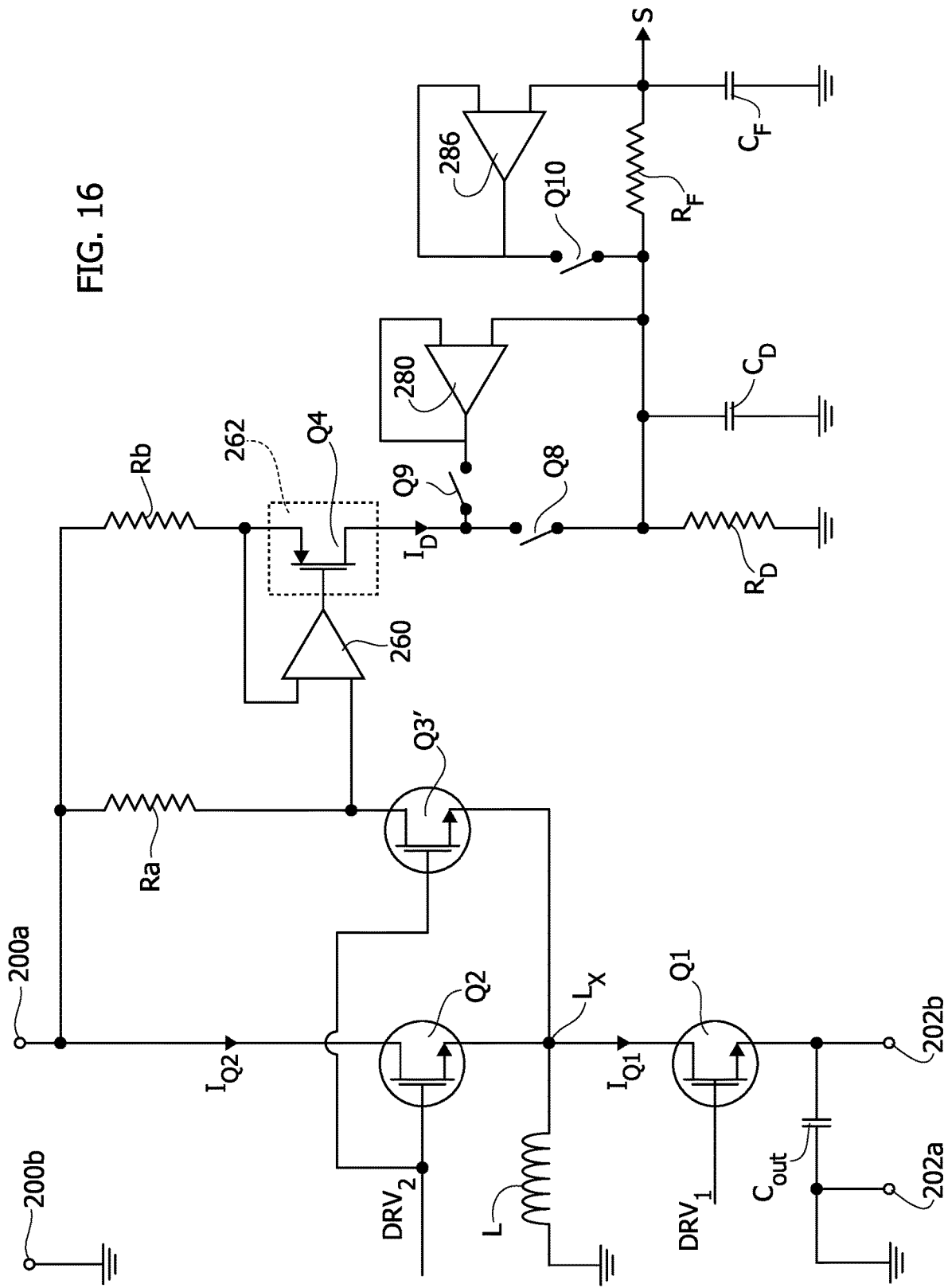
FIG. 16 shows a second embodiment of a sensor circuit configured to measure the average current flowing through the inductance of a buck-boost converter, as disclosed herein.

FIGS. 15 and 16 show also embodiments of sensor circuit 26 adapted to be used with an inverting buck-boost converter.

Generally, a buck-boost converter comprises two input terminals 200a and 200b for received an input voltage $V_{in}$ and two output terminals 202a and 202 for providing a regulated output voltage $V_{out}$ or output current $i_{out}$.

Moreover, also a buck-boost converter also comprises two electronic switches Q1 and Q2, and an inductance L, typically an inductor. Specifically, in a buck-boost converter, the two electronic switches Q1 and Q2 are connected in series between the terminals 200a and 202b. Specifically, in the embodiment considered, the (current path of the) electronic switch Q2 is connected (e.g., directly) between the terminal 200a and a switching node Lx and the (current path of the) electronic switch Q1 is connected (e.g., directly) between the switching node Lx and the terminal 202b. Moreover, the inductance L is connected (e.g., directly) between the switching node Lx and the terminal 200b, which represents a ground. Typically, the output terminal 202a is also connected to ground/terminal 200b. In various embodiments, a capacitor Cout may be connected between the terminals 202a and 202b.

Accordingly, when the electronic switch Q2 is closed (and the electronic switch Q1 is opened), the inductance L is connected to the input terminals 200a and 200b, whereby the current $I_L$ flowing through the inductance L increases substantially linearly. Conversely, when the electronic switch Q1 is closed (and the electronic switch Q2 is opened), the inductance L is connected to the output terminals 202a and 202b, whereby the current $I_L$ flowing through the inductance L decreases substantially linearly. Specifically, due to the direction of the current flow, the terminal 202b is the negative output terminal and the terminal 202a is the positive output terminal.

In the embodiment considered, the electronic switches Q1 and Q2 are again power FETs, such as two n-channel FETs, which thus may be replaced again via a plurality of parallel connected FETs.

FIG. 15 shows an embodiment of the sensor circuit for the electronic switch Q1. Specifically, the electronic switch Q1 is a low-side switch, and the sensor circuit 13 shown in FIG. 15 essentially corresponds to the sensor circuit shown in FIG. 13.

Accordingly, also in this case, a first (e.g., source) terminal of the FET Q3 is connected to a first (e.g., source) terminal of the power FET Q1, and a second (e.g., drain) terminal of the FET Q3 and a second (e.g., drain) terminal of the power FET Q1 are connected to the inputs of an operational amplifier 260, which regulates via a current source 262, such as a FET Q4, the current $I_S$ flowing through the FET Q3 until the voltage drop $V_{DS,Q3}$ between the first and second terminal of the FET Q3 corresponds to the voltage drop $V_{DS,Q1}$ between the first and second terminal of the power FET Q1, whereby (due to the scaling of the transistors Q3 and Q1) a current flows though the FET Q3, which is proportional to the current $I_{Q1}$ flowing through the power FET Q1. Accordingly, this current may be provided (e.g., via a current mirror 268) to the measurement circuit $R_D$, $C_D$, $R_F$, $C_F$, Q8, Q9, Q10, 280, 286.

Generally, as mentioned before, the measurement current is generated by imposing the drain-source voltage drop $V_{DS,Q1}$ at the power FET Q1 on the sensor FET Q3. Specifically, as shown in FIG. 15, indeed a FET may be modelled via an ideal electronic switch Q3' and a switch-on resistance $R_{DS\_on}$ connected in series with (the current path of) the electronic switch Q3'. Accordingly, in case the FET Q3 is a scaled version of the FET Q1, the respective switch-on resistance $R_{DS\_on}$ is greater, thereby resulting in a smaller current flow. Moreover, due to the scaling and an opportune arrangement of the sensor FET Q3 in the vicinity of the FET Q1, both FETs are exposed to the same process and temperature variations, whereby the proportionality between the switch-on resistance $R_{DS\_on}$ of these FETs remains rather constant. However, an additional resistor may also be connected in series with the sensor FET Q3 in order to reduce the current flow through the FET.

In this respect, the electronic switch Q3' is used to enable or disable the current flow $I_S$ through the switch-on resistance $R_{DS\_on}$, i.e., enable the current flow when the respective drive signal indicates that the power FET is closed and disable the current flow when the respective drive signal indicates that the power switch is opened.

Conversely, FIG. 16 shows an embodiment of the sensor circuit for the electronic switch Q2. Generally, in case the electronic switch Q2 is implemented with a p-channel FET, the sensor circuit shown in FIG. 14 may be used. Conversely, in the embodiment considered, the electronic switch Q2 is an n-channel FET. In this case, the circuit of FIG. 15 could be used. However, FIG. 16 shows a different embodiment.

Specifically, as mentioned before, the sensor circuits according to the previous embodiments are configured to impose, when the power FET to be monitored (i.e. FET Q2 in the embodiment considered) is closed, the drain-source voltage drop at the power FET (i.e. $V_{DS,Q2}$ for the embodiment considered) via a regulator circuit, e.g., comprising an operational amplifier 260 and a current source 262, on a (sense) resistance. In the embodiments considered in the foregoing, this (sense) resistance was implemented with the switch-on resistance $R_{DS\_on}$ of the FET Q3.

Conversely, FIG. 16 shows an embodiment, wherein a separate resistance Rb is used as (sense) resistance.

For example, in the embodiment considered, an electronic switch Q3', such as a FET, is configured to selectively connect a resistance Ra in parallel with (the current path of) the power FET to be monitored, i.e., Q2 in the embodiment considered. Specifically, in the embodiment considered, the source terminal of the FET Q3' is connected to the source terminal of the FET Q2, the drain terminal of the FET Q3' is connected via the resistor Ra to the drain terminal of the FET Q2, and the gate terminal of the FET Q3' is connected to the gate terminal of the FET Q2. Accordingly, when the FETs Q2 and Q3' are closed (via the drive signal $DRV_2$), the resistor Ra is connected in parallel to the FET Q2. Thus, by using a resistor Ra having a resistance that is significantly greater than the switch-on resistance of the switch Q3', the drain-source voltage drop $V_{DS,Q2}$ at the power FET Q2 is applied to the resistor Ra.

In the embodiment considered, an operational amplifier 260 and a current source 262 are thus used to apply the voltage drop at the resistor Ra to the sense resistor Rb. For example, in the embodiment considered, a first terminal of the resistor Rb is connected to a first terminal of the resistor Ra (drain terminal of the FET Q2). The second terminal of the resistor Rb is connected to the current source 262. Finally, a first input terminal of the operational amplifier 260 is connected to the second terminal of the resistor Ra (intermediate node between the resistor Ra and the electronic switch Q3'), a second input terminal of the operational amplifier 260 is connected to the second terminal of the resistor Rb (intermediate node between the resistor Rb and the current source 262), and the output terminal of the operational amplifier 260 drives the current source 262.

Accordingly, similarly to the previous description, when the power FET Q2 is closed (as detected via the switch Q3'), the operational amplifier 260 sets the current of the current source 262 until the voltage at the resistor Rb corresponds to the drain-source voltage drop $V_{DS,Q2}$ at the power FET Q2. Accordingly, the current flowing through the sense resistance Rb may be provided to the measurement circuit $R_D$, $C_D$, $R_F$, $C_F$, Q8, Q9, Q10, 280, 286.

Also in this case, the electronic switch Q3' is used to enable or disable the current flow $I_S$ through the sense resistance Rb, i.e., enable the current flow when the respective drive signal indicates that the power FET is closed and disable the current flow when the respective drive signal indicates that the power switch is opened. While in the previous embodiments, the electronic switch Q3' was directly connected in series with the sense resistance $R_{DS\_on}$, the electronic switch Q3' now deactivates one of the inputs of the operational amplifier 260. In general, similar to the embodiment shown in FIG. 15, the electronic switch Q3' could also disable the output of the current generator 262.

Thus, essentially, the operational amplifier 260, the electronic switch Q3' and the current source 262 (and the optional current mirror 264) represent a regulator circuit configured to:

when the drive signal applied to the gate terminal indicates that the power FET is opened, set the current flowing through the sense resistance $R_{DS\_on}$ or Rb to zero, and when the drive signal applied to the gate terminal indicates that the power FET is closed, regulate the current flowing through the sense resistance $R_{DS\_on}$ or Rb, such that the voltage drop at the sense resistance $R_{DS\_on}$ or Rb corresponds to the drain-source voltage drop of the power FET. Conversely, the remaining sensor circuit is used to monitor (directly or indirectly) the current flow through the sense resistance $R_{DS\_on}$ or Rb.

Accordingly, in the embodiments considered, one or preferably both of the electronic switches Q1 and Q2 of the electronic power converter may be implemented with a plurality of parallel connected electronic switches, and the control circuit may determine the number of electronic switches to be closed as a function of the average current flowing through one of the electronic switches Q1 and Q2.

As described in the foregoing, the sensor circuits 26 for a power-FET described herein have the advantage that the sensor circuit 26 may be used to generate:

a value $I_D/V_D$ proportional to the instantaneous value flowing through the power-FET, while the power-FET is closed;

by driving the switch Q10 as a function of a drive signal of the power FET, a signal S proportional to the average value of the current flowing through the inductance L; and optionally, by maintaining the switch Q10 opened, a signal S proportional to the average value of the current flowing through the power FET for a plurality of switching cycles $T_{SW}$.

In fact, as mentioned before, in various embodiments, the average value of the current flowing through the power FET for a plurality of switching cycles may correspond to the average value of the output current $i_{out}$.

The claims are an integral part of the technical teaching of the disclosure provided herein.

Of course, without prejudice to the principles contained in this disclosure, the details of construction and the embodiments may vary widely with respect to what has been described and illustrated herein purely by way of example, without thereby departing from the scope of this disclosure, as defined by the ensuing claims.

The invention claimed is:

1. A sensor system, comprising:
a power field effect transistor (FET) comprising first and second conduction terminals defining a current path, and a gate terminal configured to receive a drive signal; and
a sensor circuit configured to monitor a current flowing through said power FET;
wherein said sensor circuit comprises:
a sense resistance; and
a regulator circuit configured to:
when the drive signal applied to said gate terminal is set to turn the power FET off, set a first current flowing through the sense resistance to zero; and
when the drive signal applied to said gate terminal is set to turn the power FET on, regulate said first current flowing through the sense resistance such that a voltage drop at the sense resistance corresponds to a voltage drop between said first and second conduction terminals of said power FET;
a measurement circuit configured to provide a second current corresponding to said first current or being proportional to said first current;
a resistor;
a first electronic switch configured to selectively apply said second current to said resistor as a function of a first control signal;
a low pass filter configured to generate a low-pass filtered signal by filtering a voltage at said resistor resulting from the application of said second current to said resistor;
a voltage follower configured to generate a replica of said low-pass filtered signal;
a second electronic switch configured to selectively apply said replica of said low-pass filtered signal to said resistor; and
a control circuit configured to:
when said power FET is on, close said first electronic switch and open said second electronic switch to generate the voltage at said resistor proportional to an instantaneous value of said current flowing through said power FET; and
when said power FET is off, open said first electronic switch and close said second electronic switch to generate the voltage at said resistor corresponding to said low-pass filtered signal, and wherein said low-pass filtered signal is proportional to an average value of said current flowing through said power FET during periods when said power FET is on.

2. The sensor system according to claim 1, wherein said control circuit is configured to:
during a first measurement phase:
when said power FET is on, close said first electronic switch and open said second electronic switch to generate the voltage at said resistor proportional to the instantaneous value of said current flowing through said power FET; and
when said power FET is off, open said first electronic switch and close said second electronic switch to generate the voltage at said resistor corresponding to said low-pass filtered signal, and wherein said low-pass filtered signal is proportional to the average value of said current flowing through said power FET during the periods when said power FET is on; and
during a second measurement phase, maintain said second electronic switch as being open, and:
when said power FET is on, close said first electronic switch, and
when said power FET is off, open said first electronic switch to generate said low-pass filtered signal proportional to the average value of said current flowing through said power FET during the periods when said power FET is on as well as off.

3. The sensor system according to claim 1, wherein said regulator circuit comprises:
a first FET that is a scaled version of said power FET, wherein a first conduction terminal of said first FET is connected to said first conduction terminal of said power FET, wherein a gate terminal of said first FET is configured to be driven with said drive signal of said power FET, wherein a switch-on resistance of said first FET represents said sense resistance;

an operational amplifier, wherein a first input terminal of said operational amplifier is connected to said second conduction terminal of said power FET and a second input terminal of said operational amplifier is connected to said second conduction terminal of said first FET; and a variable current source configured to generate a first current as a function of a signal at an output terminal of said operational amplifier, wherein said first current generated by said variable current source is applied to said second conduction terminal of said first FET, wherein said operational amplifier regulates, via said variable current source, voltage at said second conduction terminal of said first FET to voltage at said second conduction terminal of said power FET and said first current flows through said first FET, said first current being proportional to said current flowing through said power FET.

4. The sensor system according to claim 3, wherein said variable current source comprises a second FET, wherein a gate terminal of said second FET is connected to said output terminal of said operational amplifier.

5. The sensor system according to claim 4, wherein said variable current source comprises a current mirror arrangement configured to apply current generated by said second FET to said second conduction terminal of said first FET.

6. The sensor system according to claim 4, wherein said measurement circuit comprises a third FET, wherein a gate terminal of said third FET is connected to said output terminal of said operational amplifier.

7. The sensor system according to claim 4, wherein said measurement circuit comprises a further current mirror arrangement configured to generate said second current by mirroring current generated by said second FET.

8. The sensor system according to claim 1, wherein said low pass filter comprises a further resistor and a capacitor, and wherein said low-pass filtered signal corresponds to a voltage at said capacitor.

9. The sensor system according to claim 1, implemented as an integrated circuit.

10. An electronic power converter, comprising:
two input terminals for receiving an input voltage;
two output terminals for providing a regulated output voltage or a regulated output current;
a switching circuit connected between said two input terminals and said two output terminals, wherein said switching circuit comprises an inductance, and a first power field effect transistor (FET) and a second power field effect transistor (FET) configured to control a current flowing through said inductance;
a control circuit configured to generate control signals for said first power FET and said second power FET, wherein said control circuit is configured to operate said inductance in Continuous-Conduction Mode by driving said first power FET and said second power FET with switching cycles comprising:
a first phase, wherein said first power FET is on and said second power FET is opened, wherein said current flowing through said inductance increase linearly, and
a second phase, wherein said first power FET is opened and said second power FET is no, wherein said current flowing through said inductance decrease linearly; and
a sensor circuit, wherein said sensor circuit is configured to monitor a current flowing through said first power FET or said second power FET, wherein a low-pass filtered signal is proportional to an average value of said current flowing through said inductance;
wherein said sensor circuit comprises:
a sense resistance; and
a regulator circuit configured to:
when the drive signal applied to a gate terminal of the first or second power FET is set to turn that power FET off, set a first current flowing through the sense resistance to zero; and
when the drive signal applied to said gate terminal is set to turn that power FET on, regulate said first current flowing through the sense resistance such that a voltage drop at the sense resistance corresponds to a voltage drop between first and second conduction terminals of that power FET; and
wherein said control circuit is configured to start said second phase when the voltage at said sense resistance reaches a given threshold value.

11. The electronic power converter according to claim 10, wherein said first power FET is implemented with a first plurality of parallel FETs and said second power FET is implemented with a second plurality of parallel FETs, and wherein said control circuit is configured to:
acquire said low-pass filtered signal proportional to an average value of said current flowing through said first power FET or said second power FET during the periods when said first power FET or said second power FET is closed;
determine a given number of FETs of said first and second pluralities of parallel FETs to be closed as a function of said low-pass filtered signal proportional to the average value of said current flowing through said first power FET or said second power FET during the periods when said first power FET or said second power FET is closed;
during said first phase, close said given number of FETs of said first plurality of parallel FETs; and
during said second phase, close said given number of FETs of said second plurality of parallel FETs.

12. The electronic power converter according to claim 10, wherein said control circuit is configured to vary the duration of said first phase and/or said second phase as a function of an average value of said current flowing through said first power FET or said second power FET.

13. A method of operating an electronic power converter, comprising:
operating an inductance of an electronic power converter in Continuous-Conduction Mode by driving a first power FET and a second power FET of said electronic power converter with switching cycles comprising:
a first phase, wherein said first power FET is on and said second power FET is off, wherein a current flowing through said inductance increases linearly, and
a second phase, wherein said first power FET is off and said second power FET is on, wherein said current flowing through said inductance decreases linearly; and
monitoring, using a sensor circuit of said electronic power converter, a current flowing through said first power FET or said second power FET, whereby a low-pass filtered signal is proportional to an average value of said current flowing through said inductance;
starting said second phase when a voltage at a resistor proportional to an instantaneous value of a current flowing through either the first power FET or the second power FET reaches a given threshold value.

14. The method of claim 13, wherein a power field effect transistor (FET) is either the first power FET or the second power FET; and wherein
during a first measurement phase:
when said power FET is on, close a first electronic switch and open a second electronic switch to generate a voltage at the resistor proportional to an instantaneous value of a current flowing through said power FET; and
when said power FET is off, open said first electronic switch and close said second electronic switch to generate the voltage at said resistor corresponding to said low-pass filtered signal, and wherein said low-pass filtered signal is proportional to an average value of said current flowing through said power FET during periods when said power FET is on.

15. The method of claim 14 wherein:
during a second measurement phase, maintain said second electronic switch as being open, and:
when said power FET is on, close said first electronic switch, and
when said power FET is off, open said first electronic switch to generate said low-pass filtered signal proportional to the average value of said current flowing through said power FET during the periods when said power FET is on as well as off.

16. An electronic power converter, comprising:
two input terminals for receiving an input voltage;
two output terminals for providing a regulated output voltage or a regulated output current;
a switching circuit connected between said two input terminals and said two output terminals, wherein said switching circuit comprises an inductance, and a first power field effect transistor (FET) and a second power field effect transistor (FET) configured to control a current flowing through said inductance;
a control circuit configured to generate control signals for said first power FET and said second power FET, wherein said control circuit is configured to operate said inductance by driving said first power FET and said second power FET with switching cycles comprising:
a first phase, wherein said first power FET is on and said second power FET is opened, wherein said current flowing through said inductance increases linearly, and
a second phase, wherein said first power FET is opened and said second power FET is on, wherein said current flowing through said inductance decreases linearly; and
a sensor circuit configured to monitor a current flowing through a power FET corresponding to said first power FET or said second power FET, whereby a low-pass filtered signal is proportional to an average value of said current flowing through said inductance;
wherein said sensor circuit comprises:
a sense resistance;
a regulator circuit configured to:
when a drive signal applied to a gate terminal of the power FET it set to turn the power FET off, set a first current flowing through the sense resistance to zero; and
when the drive signal applied to said gate terminal is set to turn the power FET on, regulate said first current flowing through the sense resistance, such that a voltage drop at the sense resistance corresponds to a voltage drop between first and second conduction terminals of said power FET;
a measurement circuit configured to provide a second current corresponding to said first current or being proportional to said first current;
a resistor;
a first electronic switch configured to selectively apply said second current to said resistor as a function of a first control signal;
a low pass filter configured to generate the low-pass filtered signal by filtering a voltage at said resistor resulting from the application of said second current to said resistor;
a voltage follower configured to generate a replica of said low-pass filtered signal; and
a second electronic switch configured to selectively apply said replica of said low-pass filtered signal to said resistor;
wherein said control circuit is further configured to:
when said power FET is on, close said first electronic switch and open said second electronic switch, wherein the voltage at said resistor is proportional to an instantaneous value of said current flowing through said power FET; and
when said power FET is off, open said first electronic switch and close said second electronic switch, wherein the voltage at said resistor corresponds to said low-pass filtered signal, and wherein said low-pass filtered signal is proportional to an average value of said current flowing through said power FET during periods when said power FET is on.

17. The electronic power converter according to claim 16, wherein said first power FET is implemented with a first plurality of parallel FETs and said second power FET is implemented with a second plurality of parallel FETs, and wherein said control circuit is configured to:
acquire said low-pass filtered signal proportional to an average value of said current flowing through said first power FET or said second power FET during the periods when said first power FET or said second power FET is closed;
determine a given number of FETs to be closed as a function of said low-pass filtered signal proportional to the average value of said current flowing through said first power FET or said second power FET during the periods when said first power FET or said second power FET is closed;
during said first phase, close said given number of FETs of said first plurality of parallel FETs; and
during said second phase, close said given number of FETs of said second plurality of parallel FETs.

18. The electronic power converter according to claim 16, wherein said sensor circuit is configured to monitor a current flowing through said first power FET, and wherein said control circuit is configured to start said second phase when the voltage at said resistor reaches a given threshold value.

* * * * *